US012813116B2

(12) United States Patent
Kim et al.

(10) Patent No.: US 12,813,116 B2
(45) Date of Patent: Nov. 24, 2026

(54) DISPLAY DEVICE

(71) Applicant: Samsung Display Co., LTD., Yongin-si (KR)

(72) Inventors: Sunkwang Kim, Seoul (KR); Guanghai Jin, Suwon-si (KR); Ki Nyeng Kang, Sejong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 798 days.

(21) Appl. No.: 18/192,723

(22) Filed: Mar. 30, 2023

(65) Prior Publication Data

US 2023/0354665 A1 Nov. 2, 2023

(30) Foreign Application Priority Data

Apr. 29, 2022 (KR) ........................ 10-2022-0053368

(51) Int. Cl.
*H10K 59/131* (2023.01)

(52) U.S. Cl.
CPC ................................ *H10K 59/1315* (2023.02)

(58) Field of Classification Search
CPC ............. H10K 59/131; H10K 59/1315; H10K 50/805; H10K 59/805; H10D 86/427; H10D 86/60; H10D 86/481; G09G 2300/0426; G09G 2330/028
See application file for complete search history.

(56) References Cited

U.S. PATENT DOCUMENTS 6,329,688 B1 * 12/2001 Arai ........................ H10B 41/00 438/257
9,360,691 B2 6/2016 Jeong
9,477,362 B2 * 10/2016 Ono ........................ G06F 3/0445
(Continued)

FOREIGN PATENT DOCUMENTS

| | | |
|---|---|---|
| CN | 111293126 | 6/2020 |
| CN | 218274604 | 1/2023 |

(Continued)

OTHER PUBLICATIONS

Notice of Allowance dated Aug. 20, 2026 in corresponding Korean Patent Application Serial No. 10-2022-0053368, in Korean, 7 pages.

*Primary Examiner* — Fatima N Farokhrooz
(74) *Attorney, Agent, or Firm* — F. CHAU & ASSOCIATES, LLC

(57) ABSTRACT

A display device includes a substrate, a first lower line that is disposed on the substrate, extends in a first direction and applies a first voltage to a light emitting element, a first upper line that is disposed on the first lower line, extends in a second direction perpendicular to the first direction, applies a second voltage having different from the first voltage, and crosses the first lower line, and a first floating electrode disposed between the first lower line and the first upper line, including a crossing portion overlapping the first lower line and the first upper line, a first portion extending from the crossing portion in the second direction, and a second portion extending from the crossing portion in the first direction. A length of the first portion in the second direction is longer than a length of the second portion in the first direction.

20 Claims, 23 Drawing Sheets

(56) References Cited

U.S. PATENT DOCUMENTS

| | | | | |
|---|---|---|---|---|
| 2007/0075961 | A1* | 4/2007 | Shyu | G02F 1/1368 345/98 |
| 2014/0069796 | A1* | 3/2014 | Kang | G06F 1/16 200/600 |
| 2014/0145977 | A1* | 5/2014 | Kang | G06F 3/0446 345/173 |
| 2014/0152910 | A1* | 6/2014 | Kang | G06F 1/1652 349/12 |
| 2014/0152916 | A1* | 6/2014 | Nakamura | G06F 3/0445 349/12 |
| 2015/0161943 | A1 | 6/2015 | Shim et al. | |
| 2015/0242013 | A1* | 8/2015 | Ono | G06F 3/0446 345/174 |
| 2015/0294618 | A1 | 10/2015 | Park et al. | |
| 2019/0206972 | A1 | 7/2019 | Park et al. | |
| 2023/0069761 | A1 | 3/2023 | Kim et al. | |

FOREIGN PATENT DOCUMENTS

| | | | | | |
|---|---|---|---|---|---|
| CN | 115734671 | | | 3/2023 | |
| KR | 10-2015-0066971 | A | | 6/2015 | |
| KR | 10-2015-0113530 | A | | 10/2015 | |
| KR | 10-2015-0117358 | A | | 10/2015 | |
| KR | 10-2018-0073066 | A | | 7/2018 | |
| KR | 20190008462 | A | * | 1/2019 | G02F 1/1368 |
| KR | 10-2019-0063532 | | | 6/2019 | |
| KR | 10-2019-0081618 | A | | 7/2019 | |
| KR | 10-2020-0037027 | | | 4/2020 | |
| KR | 10-2137897 | | | 8/2020 | |

* cited by examiner

DISPLAY DEVICE

CROSS-REFERENCE TO RELATED APPLICATION(S)

This application claims priority to and the benefits of Korean Patent Application No. 10-2022-0053368 under 35 U.S.C. § 119, filed on Apr. 29, 2022, in the Korean Intellectual Property Office (KIPO), the entire contents of which are incorporated hereby by reference.

BACKGROUND

1. Technical Field

Embodiments relate to display device including a floating electrode.

2. Description of the Related Art

A display device is manufactured and used in various fields. The display device may provide visual information to the user by emitting light. In order to emit light, the display device may include various light emitting elements. For example, the display device may include a liquid crystal display that emits light by using a liquid crystal layer, an inorganic light emitting display that emits light by using an inorganic light emitting diode, and an organic light emitting display that emits light by using an organic light emitting diode.

The light emitting element may emit light based on a signal applied from a driver. The driver may be disposed in a non-display area positioned around a display area in which the light emitting element is disposed. In order for the driver to be disposed, lines, pads, and the like may be positioned in the non-display area.

SUMMARY

Embodiments provide a display device capable of preventing damage to a lower line during a cutting process by disposing a floating electrode over the lower line.

A display device according to embodiments may include a substrate, a first lower line disposed on the substrate and extending in a first direction, the first lower line that applies a first voltage having a first level to a light emitting element, a first upper line disposed on the first lower line, extending in a second direction perpendicular to the first direction, and crossing the first lower line, the first upper line that applies a second voltage having a second level different from the first level of the first voltage, and a first floating electrode disposed between the first lower line and the first upper line, the first floating electrode including a crossing portion overlapping the first lower line and the first upper line, a first portion extending from the crossing portion of the first floating electrode in the second direction, and a second portion extending from the crossing portion of the first floating electrode in the first direction, wherein a length of the first portion of the first floating electrode in the second direction may be longer than a length of the second portion of the first floating electrode in the first direction.

In an embodiment, the display device may further include a first insulating layer disposed between the first lower line and the first floating electrode and a second insulating layer disposed between the first floating electrode and the first upper line. A thickness of the second insulating layer may be greater than a thickness of the first insulating layer.

In an embodiment, the display device may further include a second floating electrode disposed between the first lower line and the first floating electrode, the second floating electrode including a crossing portion overlapping the first lower line, the first upper line, and the first floating electrode, a first portion extending from the crossing portion of the second floating electrode in the second direction, and a second portion extending from the crossing portion of the second floating electrode in the first direction, wherein a length of the first portion of the second floating electrode in the second direction may be longer than a length of the second portion of the second floating electrode in the first direction.

In an embodiment, the length of the first portion of the second floating electrode in the second direction may be longer than the length of the first portion of the first floating electrode in the second direction.

In an embodiment, the first floating electrode may include a metal and the second floating electrode may include a semiconductor material.

In an embodiment, the first floating electrode may have a polygonal shape in a plan view.

In an embodiment, the first floating electrode may have a rectangular shape in a plan view.

In an embodiment, each corner portion of the first floating electrode may be rounded.

In an embodiment, the display device may further include a second lower line disposed on the substrate, extending in the first direction, and spaced apart from the first lower line in the second direction, the second lower line that applies the second voltage, a second upper line disposed on the first lower line, extending in the second direction, spaced apart from the first upper line in the first direction, and crossing the second lower line, the second upper line that applies the first voltage, and a second floating electrode disposed between the second lower line and the second upper line, the second floating electrode including: a crossing portion overlapping the second lower line and the second upper line, a first portion extending from the crossing portion of the second floating electrode in the second direction, and a second portion extending from the crossing portion of the second floating electrode in the first direction, wherein a length of the first portion of the second floating electrode in the second direction may be longer than a length of the second portion of the second floating electrode in the first direction.

In an embodiment, the display device may further include a third floating electrode disposed between the second lower line and the second floating electrode, the third floating electrode including: a crossing portion overlapping the second lower line, the second upper line, and the second floating electrode, a first portion extending from the crossing portion of the third floating electrode in the second direction, and a second portion extending from the crossing portion of the third floating electrode in the first direction, wherein a length of the first portion of the third floating electrode in the second direction may be longer than a length of the second portion of the third floating electrode in the first direction.

In an embodiment, the length of the first portion of the third floating electrode in the second direction may be longer than the length of the first portion of the second floating electrode in the second direction.

In an embodiment, the first floating electrode may include a metal, and the third floating electrode may include a semiconductor material.

In an embodiment, the display device further include a second lower line disposed on the substrate and extending in the first direction, a second upper line and a third upper line disposed on the second lower line, extending in the second direction, spaced apart from each other in the first direction, and crossing the second lower line, respectively, and a second floating electrode disposed between the second lower line and the second upper line in a crossing area where the second lower line and the second upper line overlap each other and between the second lower line and the third upper line in a crossing area where the second lower line and the third upper line overlap each other.

In an embodiment, the display device further include a second lower line disposed on the substrate and extending in the first direction, a second upper line and a third upper line disposed on the second lower line, extending in the second direction, spaced apart from each other in the first direction, and crossing the second lower line, respectively, a second floating electrode disposed between the second lower line and the second upper line in a crossing area where the second lower line and the second upper line overlap each other, and a third floating electrode disposed between the second lower line and the third upper line in a crossing area where the second lower line and the third upper line overlap each other.

In an embodiment, each of the second floating electrode and the third floating electrode may include protrusion portion protruding in opposite directions.

In an embodiment, the display device may further include a first insulating layer disposed between the first lower line and the first floating electrode and a second insulating layer disposed between the first floating electrode and the first upper line. A thickness of the second insulating layer may be greater than a thickness of the first insulating layer. The first floating electrode may have a polygonal shape in a plan view.

In an embodiment, the first floating electrode may have a rectangular shape in the plan view.

In an embodiment, each corner portion of the first floating electrode may be rounded.

In an embodiment, the display device may further include a second floating electrode disposed between the first lower line and the first floating electrode, the second floating electrode including: a crossing portion overlapping the first lower line and the first floating electrode, a first portion extending from the crossing portion of the second floating electrode in the second direction, and a second portion extending from the crossing portion of the second floating electrode in the first direction. The first floating electrode may include a metal, and the second floating electrode includes a semiconductor material.

In an embodiment, the light emitting element may include an anode electrode, an intermediate layer disposed on the anode electrode, and a cathode electrode disposed on the intermediate layer. The first voltage may be applied to the anode electrode and the second voltage may be applied to the cathode electrode.

Accordingly, in case that the first upper line is damaged and the first upper line is cut, the first floating electrode may prevent damage to the first lower line during a cutting process. For example, to prevent damage to the first lower line by cutting the first upper line in an area where the first upper line and the first floating electrode overlap may be possible.

As the shape of the first floating electrode may vary and the first floating electrode has a polygonal shape or a polygonal shape in which corner portions are rounded, by adding the first floating electrode, to reduce a step difference occurring at a corner portion or an end portion may be possible.

According to embodiments of the present disclosure, a display device includes a substrate. A first lower line (BML1 in FIGS. 2, 9, 12, 15, BML3 in FIGS. 2, 9-17, or BML10 in FIGS. 2, 9, 12, 15) is disposed over the substrate in a thickness direction, the first lower line extending in a first direction, the first lower line that applies a first voltage having a first level to a light emitting element. A first upper line (SD2 in FIGS. 7, 9-17 or SD20 in FIGS. 7, 9, 12, 15) is disposed over the first lower line in the thickness direction, the first upper line extending in a second direction perpendicular to the first direction, and crossing the first lower line, the first upper line that applies a second voltage having a second level different from the first level of the first voltage. A first floating electrode (GAT9 in FIGS. 5, 9-11, 15-17, GAT10 in FIGS. 5, 9-11, 15-17, or GAT11 in FIGS. 5, 9-11, 15-17) is disposed between the first lower line and the first upper line, with respect to the thickness direction. The first floating electrode includes a crossing portion overlapping the first lower line and the first upper line; a first portion extending from the crossing portion of the first floating electrode in the second direction; and a second portion extending from the crossing portion of the first floating electrode in the first direction. A length of the first portion of the first floating electrode in the second direction is longer than a length of the second portion of the first floating electrode in the first direction. The first direction and the second direction occupy a plane that is tangential to the thickness direction.

The display device may further include a first insulating layer (BUF or GI in FIGS. 10, 13, 16) disposed between the first lower line and the first floating electrode, with respect to the thickness direction; and a second insulating layer (ILD in FIG. 10, 13, 16) disposed between the first floating electrode and the first upper line, with respect to the thickness direction. A thickness of the second insulating layer may be greater than a thickness of the first insulating layer.

The display device may further include a second floating electrode (ACT10 in FIGS. 4, 12-17, ACT11 in FIGS. 4, 12, 15, or ACT12 in FIGS. 4, 12, 15) disposed between the first lower line and the first floating electrode. The second floating electrode may include a crossing portion overlapping the first lower line, the first upper line, and the first floating electrode; a first portion extending from the crossing portion of the second floating electrode in the second direction; and a second portion extending from the crossing portion of the second floating electrode in the first direction. A length of the first portion of the second floating electrode in the second direction may be longer than a length of the second portion of the second floating electrode in the first direction.

The length of the first portion of the second floating electrode in the second direction may be longer than the length of the first portion of the first floating electrode in the second direction.

The first floating electrode may include a metal, and the second floating electrode may include a semiconductor material.

The first floating electrode may have a polygonal shape in a plan view.

The first floating electrode may have a rectangular shape in a plan view.

Each corner portion of the first floating electrode may be rounded.

The display device may further include a second lower line (BML1 in FIGS. 2, 9, 12, 15, BML3 in FIGS. 2, 9-17, or BML10 in FIGS. 2, 9, 12, 15) disposed on the substrate, extending in the first direction, and spaced apart from the first lower line in the second direction, the second lower line that applies the second voltage. A second upper line (SD2 in FIGS. 7, 9-17 or SD20 in FIGS. 7, 9, 12, 15) may be disposed on the first lower line, extending in the second direction, spaced apart from the first upper line in the first direction, and crossing the second lower line, the second upper line that applies the first voltage. A second floating electrode (GAT9 in FIGS. 5, 9-11, 15-17, GAT10 in FIGS. 5, 9-11, 15-17, or GAT11 in FIGS. 5, 9-11, 15-17) may be disposed between the second lower line and the second upper line. The second floating electrode may include a crossing portion overlapping the second lower line and the second upper line; a first portion extending from the crossing portion of the second floating electrode in the second direction; and a second portion extending from the crossing portion of the second floating electrode in the first direction. A length of the first portion of the second floating electrode in the second direction is longer than a length of the second portion of the second floating electrode in the first direction.

The display device may further include a third floating electrode (ACT10 in FIGS. 4, 12-17, ACT11 in FIGS. 4, 12, 15, or ACT12 in FIGS. 4, 12, 15) disposed between the second lower line and the second floating electrode. The third floating electrode may include a crossing portion overlapping the second lower line, the second upper line, and the second floating electrode; a first portion extending from the crossing portion of the third floating electrode in the second direction; and a second portion extending from the crossing portion of the third floating electrode in the first direction. A length of the first portion of the third floating electrode in the second direction may be longer than a length of the second portion of the third floating electrode in the first direction.

The length of the first portion of the third floating electrode in the second direction may be longer than the length of the first portion of the second floating electrode in the second direction.

The first floating electrode may include a metal, and the third floating electrode may include a semiconductor material.

The display device may further include a second lower line (BML12 in FIGS. 20-22) disposed on the substrate and extending in the first direction. A second upper line (SD22 in FIGS. 20-22) and a third upper line (SD23 in FIGS. 20-22) may be disposed on the second lower line, extending in the second direction, spaced apart from each other in the first direction, and crossing the second lower line, respectively. A second floating electrode (GAT16 in FIGS. 20-22) may be disposed between the second lower line and the second upper line in a crossing area where the second lower line and the second upper line overlap each other and between the second lower line and the third upper line in a crossing area where the second lower line and the third upper line overlap each other.

The display device may further include a second lower line (BML12 in FIGS. 21-22) disposed on the substrate and extending in the first direction. A second upper line (SD22 in FIGS. 21-22) and a third upper line (SD23 in FIGS. 21-22) may be disposed on the second lower line, extending in the second direction, spaced apart from each other in the first direction, and crossing the second lower line, respectively. A second floating electrode (GAT16 in FIGS. 21-22) may be disposed between the second lower line and the second upper line in a crossing area where the second lower line and the second upper line overlap each other. A third floating electrode (GAT16 in FIGS. 21-22) may be disposed between the second lower line and the third upper line in a crossing area where the second lower line and the third upper line overlap each other.

Each of the second floating electrode and the third floating electrode may include protrusion portions protruding in opposite directions.

The display device may further include a first insulating layer (BUF or GI in FIGS. 10, 13, 16) disposed between the first lower line and the first floating electrode. A second insulating layer (ILD in FIG. 10, 13, 16) may be disposed between the first floating electrode and the first upper line. A thickness of the second insulating layer may be greater than a thickness of the first insulating layer, and the first floating electrode may have a polygonal shape in a plan view.

The first floating electrode may have a rectangular shape in the plan view.

Each corner portion of the first floating electrode may be rounded.

The display device may further include a second floating electrode (ACT10 in FIGS. 4, 12-17, ACT11 in FIGS. 4, 12, 15, or ACT12 in FIGS. 4, 12, 15) disposed between the first lower line and the first floating electrode. The second floating electrode may include a crossing portion overlapping the first lower line and the first floating electrode; a first portion extending from the crossing portion of the second floating electrode in the second direction; and a second portion extending from the crossing portion of the second floating electrode in the first direction. The first floating electrode may include a metal, and the second floating electrode may include a semiconductor material.

The light emitting element may include an anode electrode; an intermediate layer disposed on the anode electrode; and a cathode electrode disposed on the intermediate layer. The first voltage may be applied to the anode electrode, and the second voltage may be applied to the cathode electrode.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Figure 1:
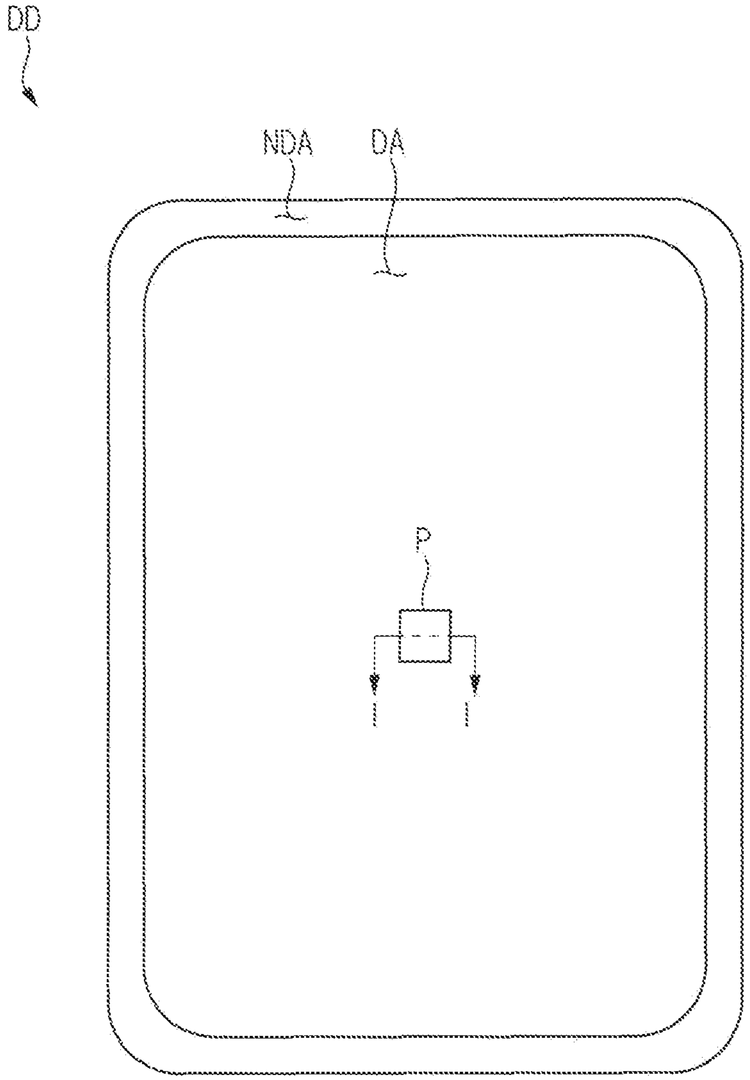
FIG. 1 is a schematic plan view illustrating a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

FIG. 1 is a schematic plan view illustrating a display device according to an embodiment. FIGS. 2, 3, 4, 5, 6, and 7 are schematic diagrams illustrating a layout of pixels included in the display device of FIG. 1.

Referring to FIG. 1, the display device DD may include a display area DA and a non-display area NDA. The display area DA may be an area in which light is emitted or an image is displayed. The non-display area NDA may be an area in which elements (or components) for transmitting signals transmitted to the display area DA are disposed.

Pixels P may be disposed in the display area DA. The pixels P may emit light based on a signal transmitted from the non-display area NDA. The pixels P may be disposed in the display area DA. Thus, the display area DA may display an image by emitting light.

Drivers may be disposed in the non-display area NDA. The drivers may generate and transmit signals for driving the pixels P, such as a gate signal, a light emitting signal, a data signal, a high power voltage, a low power voltage, an initialization voltage, and the like.

Figure 2:
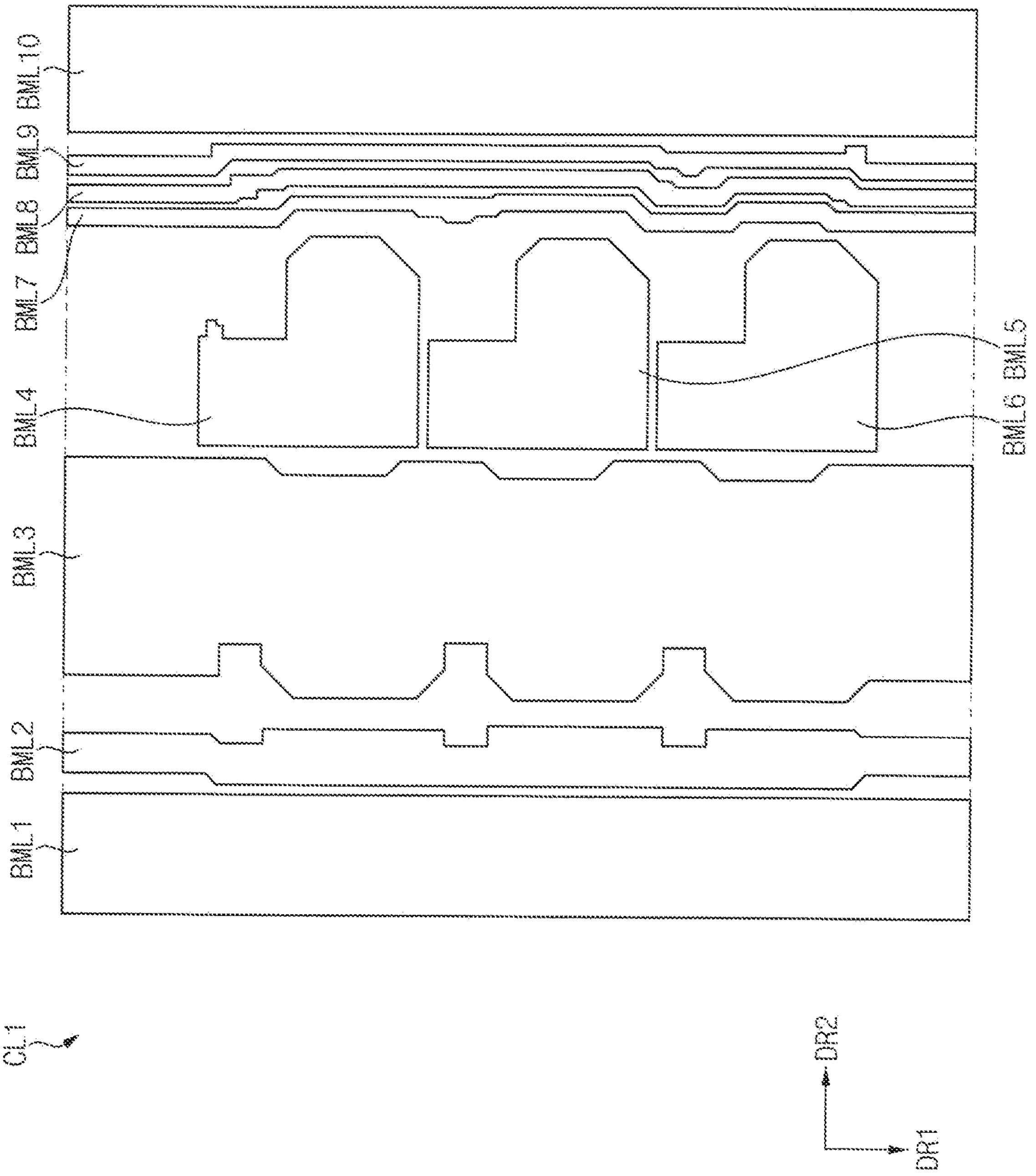
FIGS. 2, 3, 4, 5, 6, and 7 are schematic diagrams illustrating a layout of pixels included in the display device of FIG. 1.

Referring to FIGS. 1 and 2, the display device DD may include a first conductive layer CL1. The first conductive layer CL1 may include first to third lower lines (e.g., first to third lower wirings) BML1, BML2, and BML3, first to third lower electrodes BML4, BML5, and BML6, and fourth to seventh lower lines (e.g., fourth to seventh lower wirings) BML7, BML8, BML9, and BML10.

The first conductive layer CL1 may include a metal, an alloy, a metal oxide, a transparent conductive material, and/or the like. Examples of the material of the first conductive layer CL1 may include silver (Ag), an alloy containing silver, molybdenum (Mo), an alloy containing molybdenum, aluminum (Al), an alloy containing aluminum, aluminum nitride ($Al_xN_y$), tungsten (W), tungsten nitride ($W_xN_y$), copper (Cu), nickel (Ni), chromium (Cr), chromium nitride ($Cr_xN_y$), titanium (Ti), tantalum (Ta), platinum (Pt), scandium (Sc), indium tin oxide (ITO), indium zinc oxide (IZO), and the like. These may be used alone or in combination with each other.

A first voltage may be applied to the first lower line BML1 and the seventh lower line BML10. The first voltage may have a first level. The first voltage may be transferred in a first direction DR1 along the first lower line BML1 and the seventh lower line BML10. The first voltage may be applied to a light emitting element later. A first scan signal or an initialization voltage may be applied to the second lower line BML2. The first scan signal or the initialization voltage may be transferred in the first direction DR1 along the second lower line BML2. A second voltage may be applied to the third lower line BML3. The second voltage may have a second level different from the first level. The second voltage may be transferred in the first direction DR1 along the third lower line BML3. The first level may be different from the second level. For example, the first level may be greater than the second level. For example, the first voltage may be applied to an anode electrode of the light emitting element, and the second voltage may be applied to a cathode electrode of the light emitting element. In another example, the first level may be smaller than the second level, the first voltage may be applied to the cathode electrode of the light emitting element, and the second voltage may be applied to the anode electrode of the light emitting element. Hereinafter, a case in which the second level is greater than the first level will be described as an example.

The first to third lower electrodes BML4, BML5, and BML6 may be disposed to be spaced apart from each other in the first direction DR1.

The fourth to sixth lower lines BML7, BML8, and BML9 may each extend in the first direction DR1 and may be spaced apart from each other in a second direction DR2 intersecting the first direction DR1. Different data voltages may be applied to the fourth to sixth lower lines BML7, BML8, and BML9, respectively.

Figure 3:
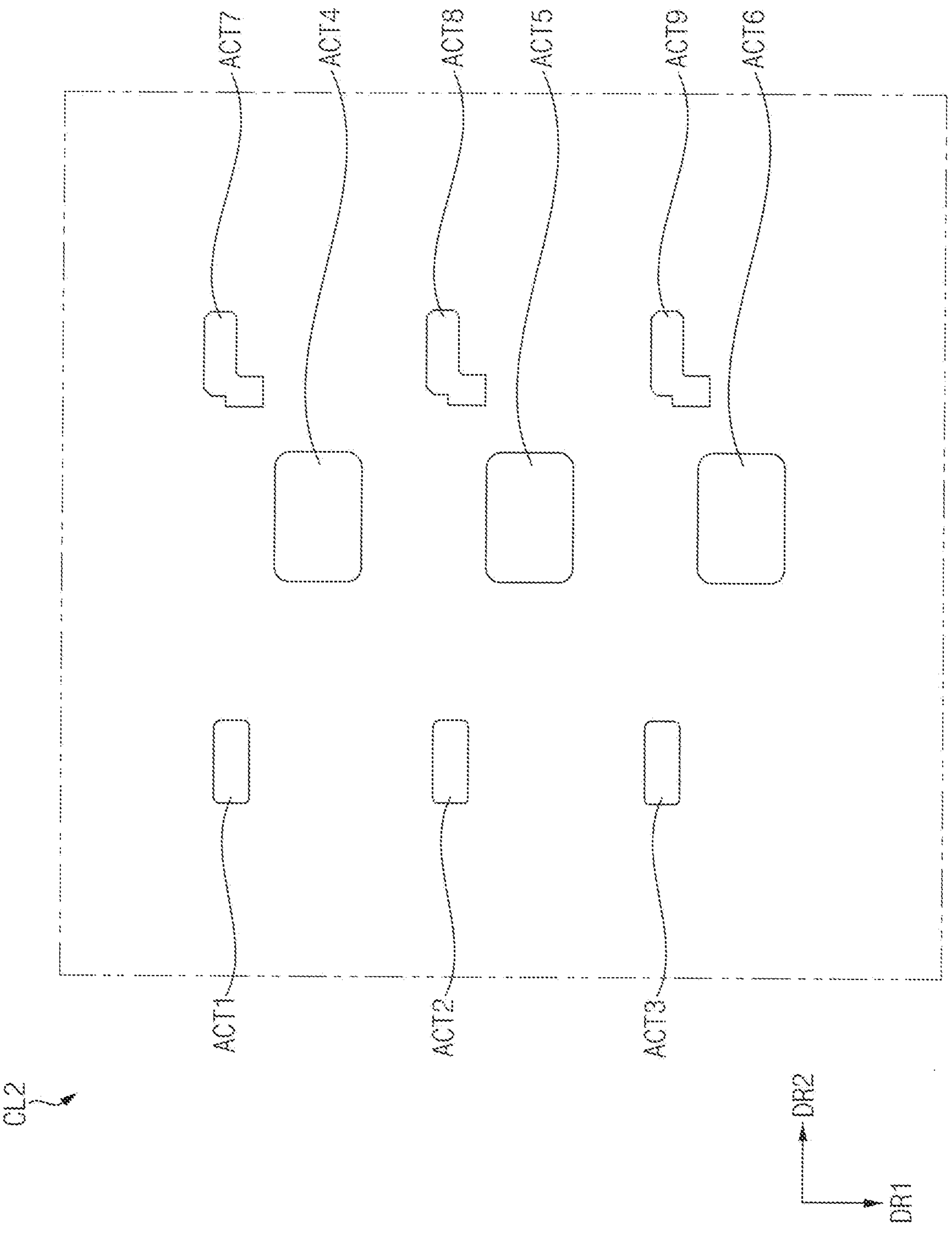

Referring to FIGS. 1, 2, and 3, the second conductive layer CL2 may be disposed on the first conductive layer CL1. An insulating layer may be disposed between the second conductive layer CL2 and the first conductive layer CL1. The second conductive layer CL2 may include first to ninth active patterns ACT1, ACT2, ACT3, ACT4, ACT5, ACT6, ACT7, ACT8, and ACT9.

The second conductive layer CL2 may include a semiconductor material. For example, the second conductive layer CL2 may include a silicon-based semiconductor material. The silicon-based semiconductor material may include amorphous silicon, polycrystalline silicon, and the like. In another example, the second conductive layer CL2 may include an oxide-based semiconductor material. The oxide-based semiconductor material may include indium-gallium-zinc oxide (IGZO), indium-gallium oxide (IGO), indium-zinc oxide (IZO), and the like.

Figure 4:
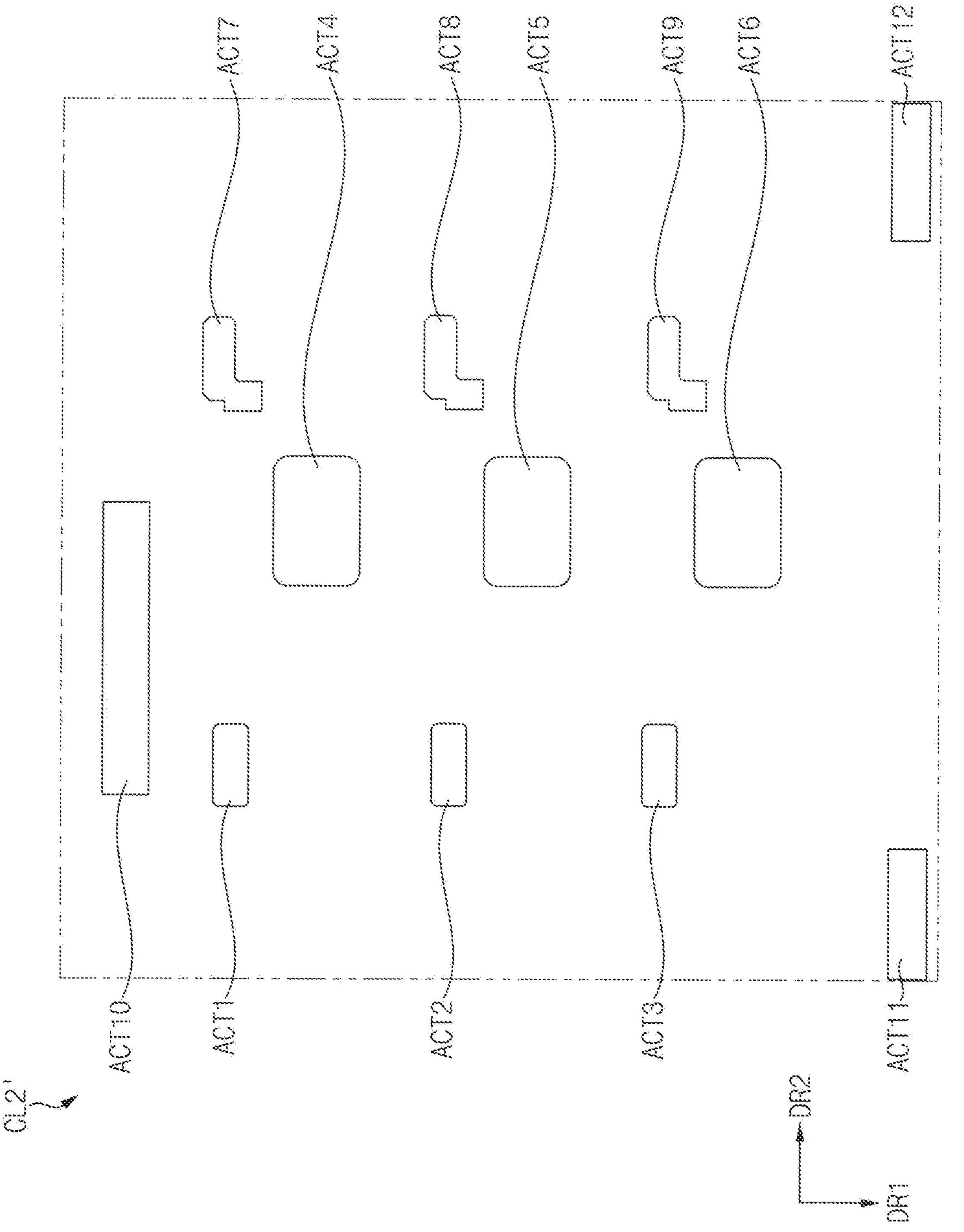

Referring to FIGS. 1, 2, 3, and 4, the second conductive layer CL2' of FIG. 4 may be substantially the same as the second conductive layer CL2 of FIG. 3 except that the tenth to twelfth active patterns ACT10, ACT11, and ACT12 are added. The display device DD may be formed of the second conductive layer CL2 and/or the second conductive layer CL2'.

Each of the tenth to twelfth active patterns ACT10, ACT11, and ACT12 may function as a floating electrode. For example, each of the tenth to twelfth active patterns ACT10, ACT11, and ACT12 may have an electrically floating state and may be electrically isolated. This will be described below.

Referring to FIGS. 1, 2, 3, 4, and 5, the third conductive layer CL3 may be disposed on the second conductive layer CL2 or the second conductive layer CL2'. An insulating layer may be disposed between the third conductive layer CL3 and the second conductive layer CL2 or the second conductive layer CL2'. The third conductive layer CL3 may include first to fourteenth gate electrodes GAT1, GAT2, GAT3, GAT4, GAT5, GAT6, GAT7, GAT8, GAT9, GAT10, GAT11, GAT12, GAT13, and GAT14. The ninth to eleventh gate electrodes GAT9, GAT10, and GAT11 may function as floating electrodes. For example, each of the ninth to eleventh gate electrodes GAT9, GAT10, and GAT11 may have an electrically floating state and may be electrically isolated. This will be described below.

The third conductive layer CL3 may include a metal, an alloy, a metal oxide, a transparent conductive material, and/or the like. Examples of the material of the third conductive layer CL3 may include silver (Ag), an alloy containing silver, molybdenum (Mo), an alloy containing molybdenum, aluminum (Al), an alloy containing aluminum, aluminum nitride ($Al_xN_y$), tungsten (W), tungsten nitride ($W_xN_y$), copper (Cu), nickel (Ni), chromium (Cr), chromium nitride ($Cr_xN_y$), titanium (Ti), tantalum (Ta), platinum (Pt), scandium (Sc), indium tin oxide (ITO), indium zinc oxide (IZO), and the like. These may be used alone or in combination with each other.

Figure 5:
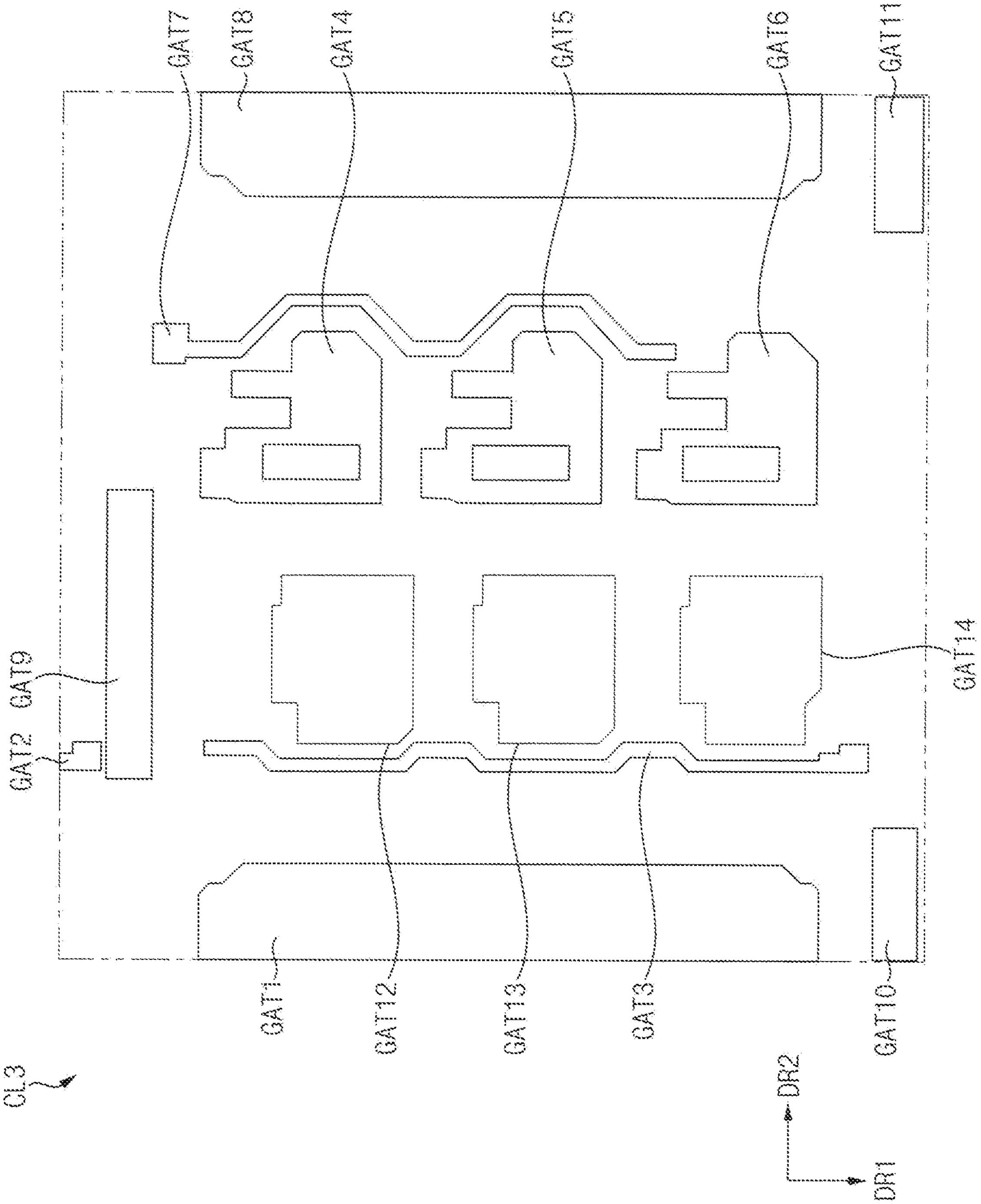
Figure 6:
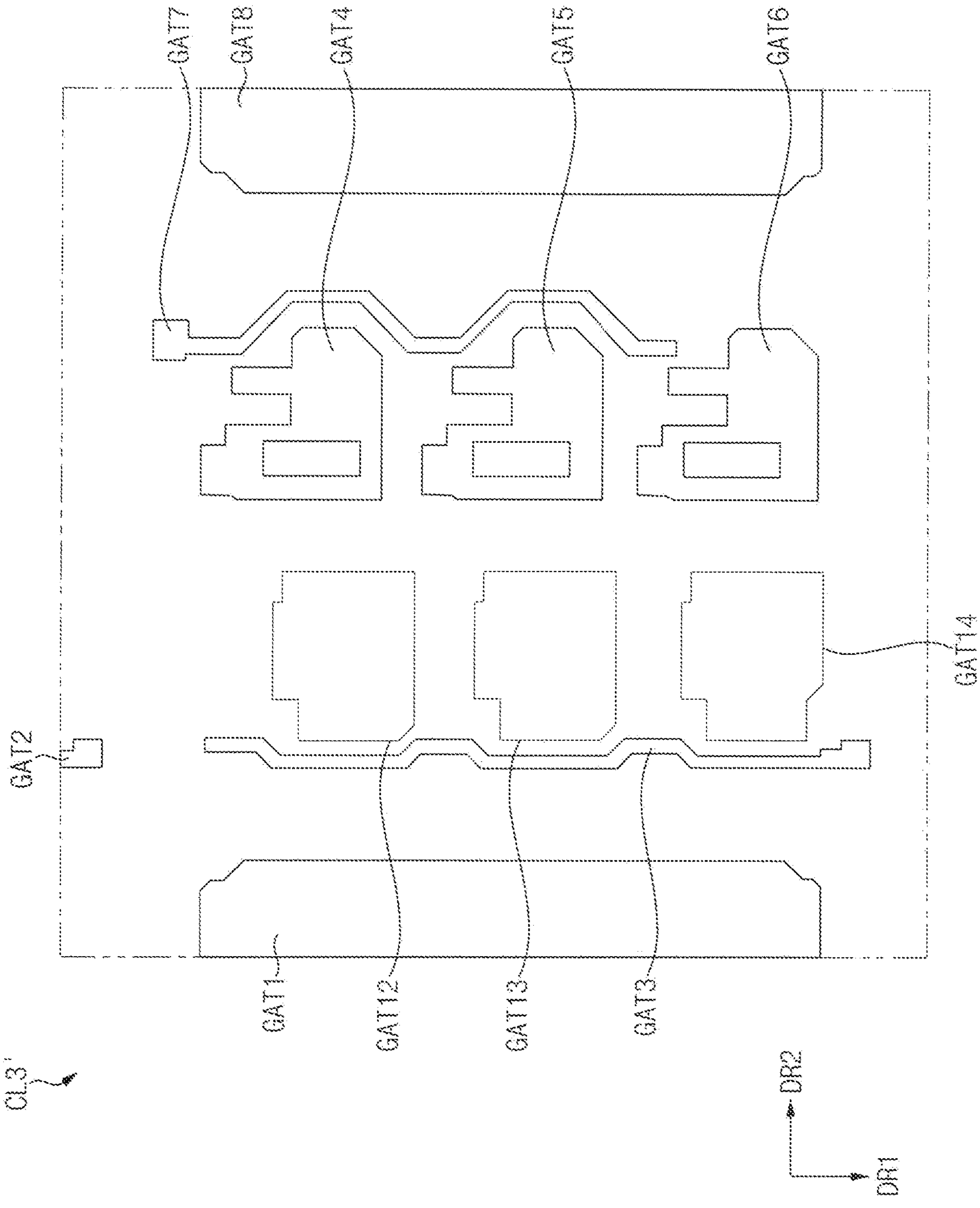
Figure 7:
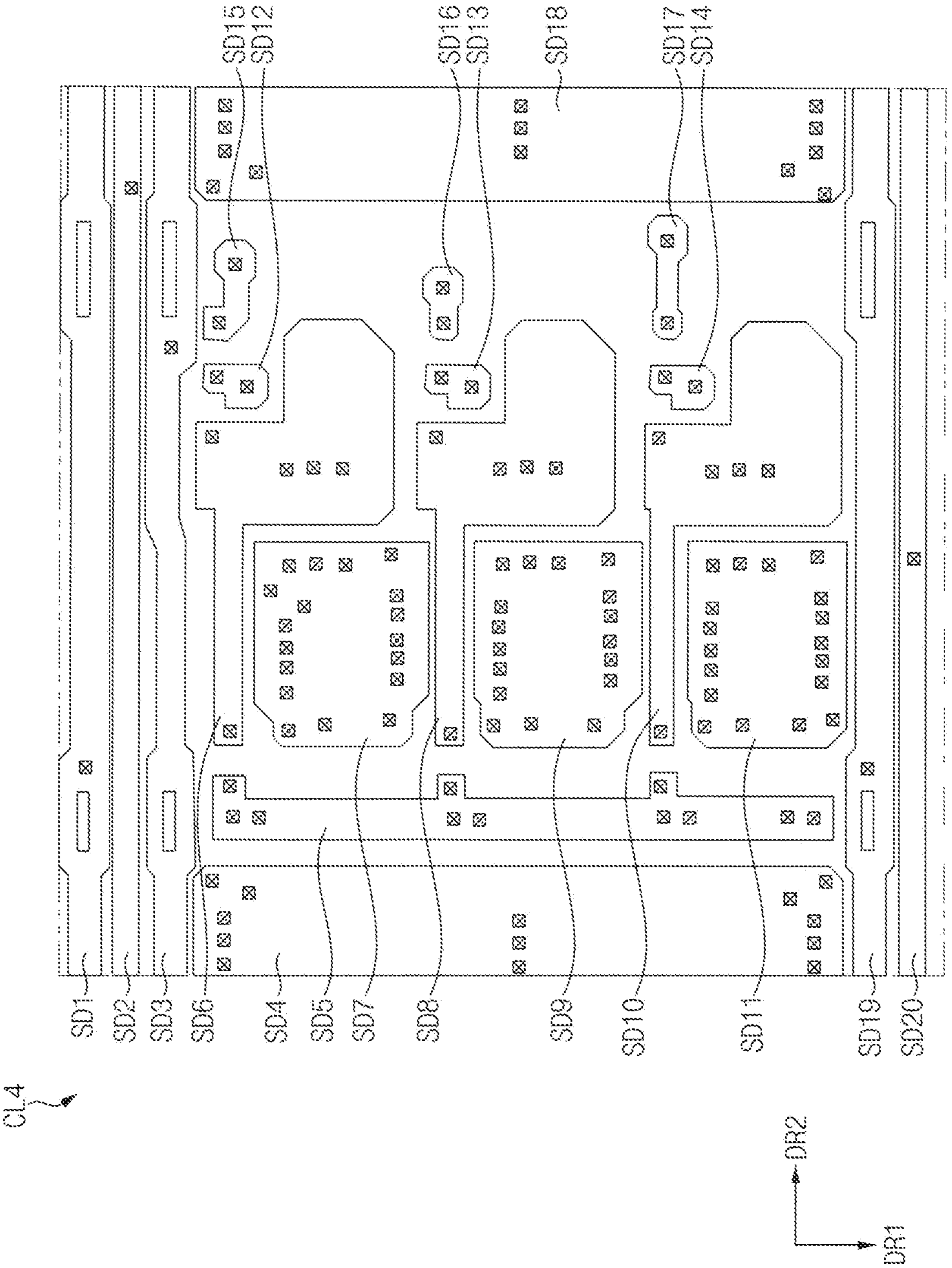

Referring to FIGS. 1, 2, 3, 4, 5, and 6, the third conductive layer CL3' of FIG. 6 may be substantially the same as the third conductive layer CL3 of FIG. 5 except that the ninth to eleventh gate electrodes GAT9, GAT10, and GAT11 are omitted. The display device DD may be formed of the third conductive layer CL3 and/or the third conductive layer CL3'.

Referring to FIGS. 1, 2, 3, 4, 5, 6, and 7, the fourth conductive layer CL4 may be disposed on the third conductive layer CL3 or the third conductive layer CL3'. An insulating layer may be disposed between the fourth conductive layer CL4 and the third conductive layer CL3 or the third conductive layer CL3'. The fourth conductive layer CL4 may include first to third upper lines (e.g., first to third upper wirings) SD1, SD2, and SD3, first to fifteenth upper electrodes SD4, SD5, SD6, SD7, SD8, SD9, SD10, SD11, SD12, SD13, SD14, SD15, SD16, SD17, and SD18, a fourth upper line (e.g., a fourth upper wiring) SD19, and a fifth upper line (e.g., a fifth upper wiring) SD20.

The fourth conductive layer CL4 may include a metal, an alloy, a metal oxide, a transparent conductive material, and/or the like. Examples of the material of the fourth conductive layer CL4 may include silver (Ag), an alloy containing silver, molybdenum (Mo), an alloy containing molybdenum, aluminum (Al), an alloy containing aluminum, aluminum nitride ($Al_xN_y$), tungsten (W), tungsten nitride ($W_xN_y$), copper (Cu), nickel (Ni), chromium (Cr), chromium nitride ($Cr_xN_y$), titanium (Ti), tantalum (Ta), platinum (Pt), scandium (Sc), indium tin oxide (ITO), indium zinc oxide (IZO), and the like. These may be used alone or in combination with each other.

The first upper line SD1 may extend in the second direction DR2. The first upper line SD1 may be connected (e.g., electrically connected) to the second gate electrode GAT2 by a contact hole. A second scan signal may be applied to the first upper line SD1 and the fourth upper line SD19. The second scan signal may be transferred in the second direction DR2 along the first upper line SD1 and the fourth upper line SD19.

The second upper line SD2 may extend in the second direction DR2. The second upper line SD2 may be connected (e.g., electrically connected) to the seventh lower line BML10 through a contact hole. Accordingly, the first voltage may be applied to the second upper line SD2. The second upper line SD2 may also overlap the first lower line BML1 and the third lower line BML3. Current leakage may occur between the third lower line BML3 and the second upper line SD2 by voltages respectively applied to the third lower line BML3 and the second upper line SD2. To prevent the current leakage, a floating electrode may be disposed between the third lower line BML3 and the second upper line SD2. The structure of the floating electrode will be described below. The floating electrode may be disposed not only between the third lower line BML3 and the second upper line SD2, but also between other lines through which a voltage is transferred.

The third upper line SD3 may extend in the second direction DR2. The third upper line SD3 may be connected (e.g., electrically connected) to the seventh gate electrode GAT7 through a contact hole. A third scan signal may be applied to the third upper line SD3. The third scan signal may be transferred in the second direction DR2 along the third upper line SD3. For example, the third scan signal may also be applied to the seventh gate electrode GAT7. The seventh to ninth active patterns ACT7, ACT8, and ACT9 may be activated based on the third scan signal.

The first upper electrode SD4 may be positioned to overlap the first lower line BML1. The first upper electrode SD4 may be connected (e.g., electrically connected) to the first gate electrode GAT1 and the first lower line BML1 through a contact hole. The first upper electrode SD4 and the first gate electrode GAT1 may function to lower the resistance of the first lower line BML1.

The second upper electrode SD5 may be disposed to overlap the second lower line BML2. The second upper electrode SD5 may be connected (e.g., electrically connected) to the second lower line BML2 and the first to third active patterns ACT1, ACT2, and ACT3 through a contact hole. Thus, the first scan signal or the initialization voltage may be applied to the second upper electrode SD5 and the first to third active patterns ACT1, ACT2, and ACT3.

The third upper electrode SD6 may be connected (e.g., electrically connected) to the first lower electrode BML4, the first active pattern ACT1, and the fourth active pattern ACT4 through a contact hole. The first lower electrode BML4 and the third upper electrode SD6 may form a capacitor together with the fourth gate electrode GAT4.

The fourth upper electrode SD7 may be connected (e.g., electrically connected) to the third lower line BML3, the fourth active pattern ACT4, and the twelfth gate electrode GAT12 through a contact hole. The twelfth gate electrode GAT12 may function to lower the resistance of the third lower line BML3.

The fifth upper electrode SD8 may be connected (e.g., electrically connected) to the second lower electrode BML5, the second active pattern ACT2, and the fifth active pattern ACT5 through a contact hole. The second lower electrode BML5 and the fifth upper electrode SD8 may form a capacitor together with the fifth gate electrode GAT5.

The sixth upper electrode SD9 may be connected (e.g., electrically connected) to the third lower line BML3, the fifth active pattern ACT5, and the thirteenth gate electrode GAT13 through a contact hole. The thirteenth gate electrode GAT13 may function to lower the resistance of the third lower line BML3.

The seventh upper electrode SD10 may be connected (e.g., electrically connected) to the third lower electrode BML6, the third active pattern ACT3, and the sixth active pattern ACT6 through a contact hole. The third lower electrode BML6 and the seventh upper electrode SD10 may form a capacitor together with the sixth gate electrode GAT6.

The eighth upper electrode SD11 may be connected (e.g., electrically connected) to the third lower line BML3, the sixth active pattern ACT6, and the fourteenth gate electrode GAT14 through a contact hole. The fourteenth gate electrode GAT14 may function to lower the resistance of the third lower line BML3.

The ninth upper electrode SD12 may be connected (e.g., electrically connected) to the fourth gate electrode GAT4 and the seventh active pattern ACT7 through a contact hole. The tenth upper electrode SD13 may be connected (e.g., electrically connected) to the fifth gate electrode GAT5 and the eighth active pattern ACT8 through a contact hole. The eleventh upper electrode SD14 may be connected (e.g., electrically connected) to the sixth gate electrode GAT6 and the ninth active pattern ACT9 through a contact hole.

In case that a data voltage is applied to the fourth gate electrode GAT4, the fourth active pattern ACT4 may be activated. In case that the data voltage is applied to the fifth gate electrode GAT5, the fifth active pattern ACT5 may be activated. In case that the data voltage is applied to the sixth gate electrode GAT6, the sixth active pattern ACT6 may be activated.

The twelfth upper electrode SD15 may be connected (e.g., electrically connected) to the seventh active pattern ACT7 and the fifth lower line BML8 through a contact hole. The thirteenth upper electrode SD16 may be connected (e.g., electrically connected) to the eighth active pattern ACT8 and the fourth lower line BML7 through a contact hole. The fourteenth upper electrode SD17 may be connected (e.g., electrically connected) to the ninth active pattern ACT9 and the sixth lower line BML9 through a contact hole.

The fifteenth upper electrode SD18 may be connected (e.g., electrically connected) to the seventh lower line BML10 and the eighth gate electrode GAT8 through a contact hole. The fifteenth upper electrode SD18 and the eighth gate electrode GAT8 may serve to lower the resistance of the seventh lower line BML10.

The fourth upper line SD19 may extend in the second direction DR2. The second scan signal may be applied to the fourth upper line SD19. The second scan signal may be transferred in the second direction DR2 along the fourth upper line SD19. The fourth upper line SD19 may be connected (e.g., electrically connected) to the third gate electrode GAT3 by a contact hole. In case that the second scan signal is applied to the third gate electrode GAT3, the first to third active patterns ACT1, ACT2, and ACT3 may be activated.

The fifth upper line SD20 may extend in the second direction DR2. The fifth upper line SD20 may be connected (e.g., electrically connected) to the third lower line BML3 through a contact hole. Thus, the second voltage applied to the third lower line BML3 may also be applied to the fifth upper line SD20.

Figure 8:
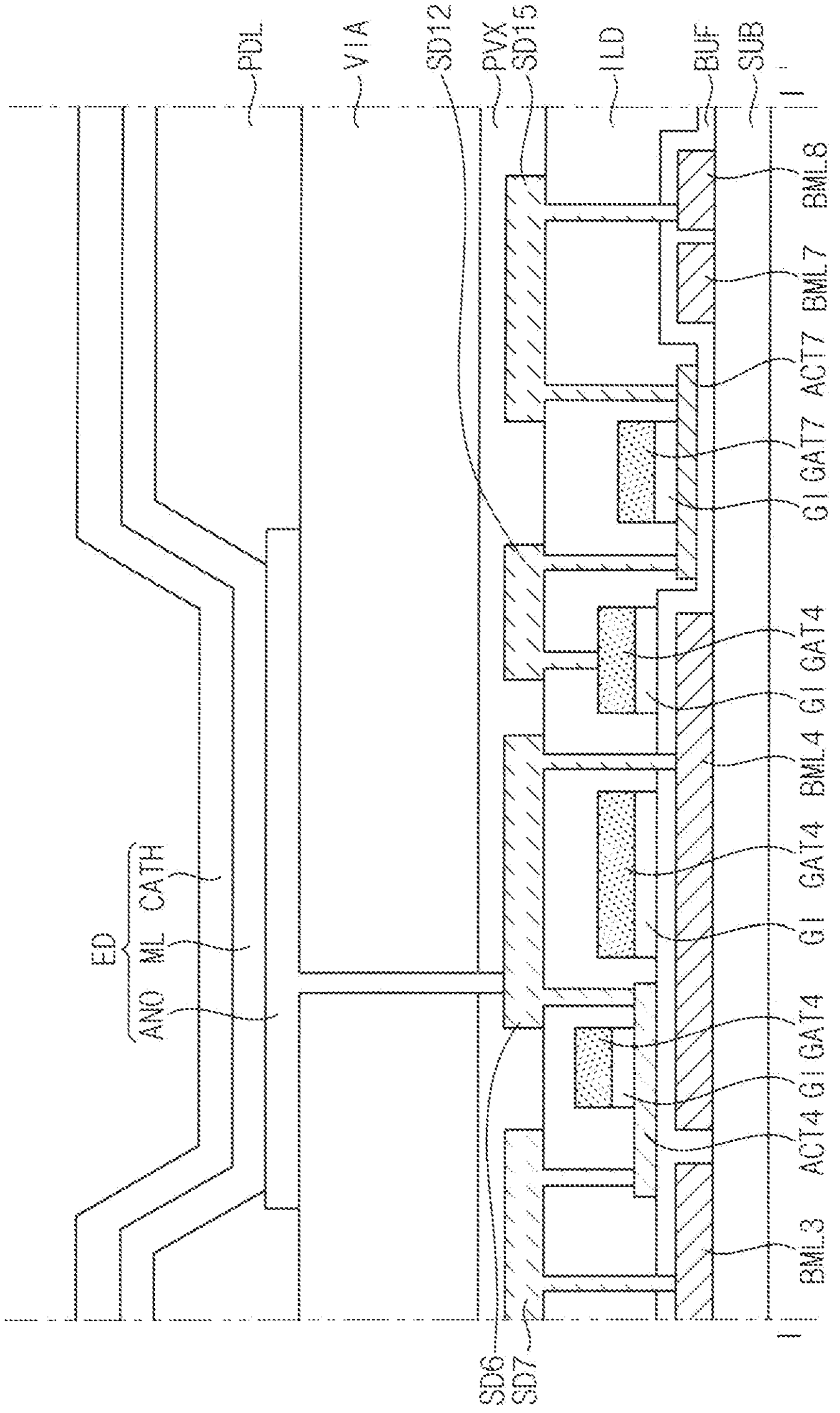
FIG. 8 is a schematic cross-sectional view illustrating an embodiment taken along line I-I' of FIG. 1.

FIG. 8 is a schematic cross-sectional view illustrating an embodiment taken along line I-I' of FIG. 1.

Referring to FIG. 8, the third lower line BML3, the first lower electrode BML4, the fourth lower line BML7, and the fifth lower line BML8 may be disposed on the substrate SUB. A first insulating layer BUF may be disposed on the substrate SUB to cover the third lower line BML3, the first lower electrode BML4, the fourth lower line BML7, and the fifth lower line BML8. The first insulating layer BUF may include an inorganic insulating material. Examples of the inorganic insulating material may include silicon oxide, silicon nitride, silicon oxynitride, and the like. These may be used alone or in combination with each other.

The fourth active pattern ACT4 and the seventh active pattern ACT7 may be disposed on the first insulating layer BUF. A second insulating layer GI may be disposed on the fourth active pattern ACT4, the seventh active pattern ACT7, and the first insulating layer BUF. The second insulating layer GI may include the inorganic insulating material.

The fourth gate electrode GAT4 and the seventh gate electrode GAT7 may be disposed on the second insulating layer GI. The third insulating layer ILD may be disposed on the first insulating layer BUF to cover the fourth active pattern ACT4, the seventh active pattern ACT7, the fourth gate electrode GAT4, and the seventh gate electrode GAT7. The third insulating layer ILD may include an inorganic insulating material.

The third upper electrode SD6, the fourth upper electrode SD7, the ninth upper electrode SD12, and the twelfth upper electrode SD15 may be disposed on the third insulating layer ILD. The third upper electrode SD6 may be connected (e.g., electrically connected) to the fourth active pattern ACT4 and the first lower electrode BML4 through a contact hole. The fourth upper electrode SD7 may be connected (e.g., electrically connected) to the third lower line BML3 and the fourth active pattern ACT4 through a contact hole. The ninth upper electrode SD12 may be connected (e.g., electrically connected) to the fourth gate electrode GAT4 and the seventh active pattern ACT7 through a contact hole. The twelfth upper electrode SD15 may be connected (e.g., electrically connected) to the seventh active pattern ACT7 and the fifth lower line BML8 through a contact hole.

A fourth insulating layer PVX may be disposed to cover the third upper electrode SD6, the fourth upper electrode SD7, the ninth upper electrode SD12, and the twelfth upper electrode SD15. The fourth insulating layer PVX may include the inorganic insulating material. A fifth insulating layer VIA may be disposed on the fourth insulating layer PVX. The fifth insulating layer VIA may include an organic insulating material. Examples of the organic insulating material may include polyacrylic resin, polyimide resin, acrylic resin, and the like. These may be used alone or in combination with each other.

An anode electrode ANO may be disposed on the fifth insulating layer VIA. The anode electrode ANO may be connected (e.g., electrically connected) to the third upper electrode SD6 through a contact hole.

The anode electrode ANO may include a metal, a metal oxide, a metal nitride, and/or the like. Examples of the metal may include silver, molybdenum, aluminum, tungsten (W), copper (Cu), nickel (Ni), chromium (Cr), titanium (Ti), tantalum (Ta), platinum (Pt), and scandium (Sc), and the like. These may be used alone or in combination with each other. Examples of the metal oxide may include indium tin oxide (ITO), indium zinc oxide (IZO), and the like. These may be used alone or in combination with each other. Examples of the metal nitride may include aluminum nitride ($Al_xN_y$), tungsten nitride ($W_xN_y$), chromium nitride ($Cr_xN_y$), and the like. These may be used alone or in combination with each other.

A pixel defining layer PDL may be disposed on the fifth insulating layer VIA. An opening exposing the anode electrode ANO may be formed in the pixel defining layer PDL. The pixel defining layer PDL may include an organic insulating material.

In an embodiment, an intermediate layer ML may be disposed on the anode electrode ANO and the pixel defining layer PDL. The intermediate layer ML may include an organic material emitting light of a preset color. For example, all of the intermediate layers ML may include an organic material for emitting blue light. For example, the intermediate layer ML may have a structure in which blue organic light emitting layers are stacked. For example, the intermediate layer ML may have a structure in which three blue organic light emitting layers are stacked.

In another example, the intermediate layer ML may have a structure in which blue organic light emitting layers and an organic light emitting layer emitting light of different colors from blue are stacked. For example, the intermediate layer ML may have a structure in which three blue organic light emitting layers and one green organic light emitting layer are stacked.

In another example, the intermediate layer ML may be disposed to overlap only the anode electrode ANO. For example, the intermediate layer ML may be disposed on the anode electrode ANO and accommodated in (or surrounded by) the opening of the pixel defining layer PDL. The intermediate layer ML may include at least one of an organic material for emitting blue light, an organic material for emitting green light, and an organic material for emitting red light.

A cathode electrode CATH may be disposed on the intermediate layer ML. The cathode electrode CATH may include a metal, a metal oxide, a metal nitride, and/or the like. Examples of the metal may include silver, molybdenum, aluminum, tungsten (W), copper (Cu), nickel (Ni), chromium (Cr), titanium (Ti), tantalum (Ta), platinum (Pt), scandium (Sc), and the like. These may be used alone or in combination with each other. Examples of the metal oxide may include indium tin oxide (ITO), indium zinc oxide (IZO), and the like. These may be used alone or in combination with each other. Examples of the metal nitride may include aluminum nitride ($Al_xN_y$), tungsten nitride ($W_xN_y$), chromium nitride ($Cr_xN_y$), and the like. These may be used alone or in combination with each other.

Figure 9:
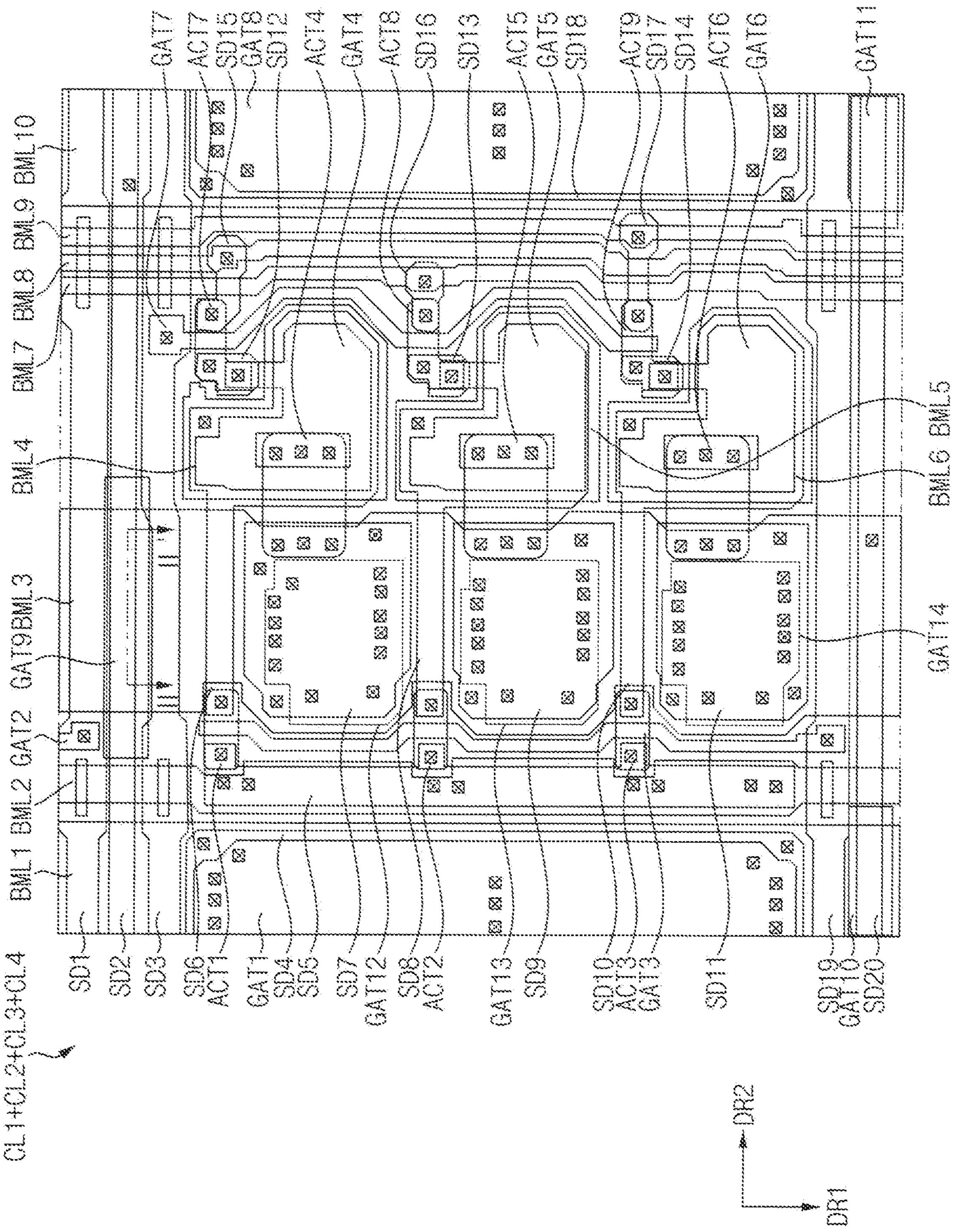
FIG. 9 is a schematic diagram combining FIGS. 2, 3, 5 and 7.

FIG. 9 is a schematic diagram combining FIGS. 2, 3, 5 and 7.

Referring to FIG. 9, different voltages may be applied to the first lower line BML1 and the fifth upper line SD20. Thus, a short circuit due to current leakage may occur in an area where the first lower line BML1 and the fifth upper line SD20 overlap. Accordingly, in the area where the tenth gate electrode GAT10 overlaps the first lower line BML1 and the fifth upper line SD20, the tenth gate electrode GAT10 may be disposed as a floating electrode between the first lower line BML1 and the fifth upper line SD20 to prevent the short circuit between the first lower line BML1 and the fifth upper line SD20.

For example, different voltages may be applied to the third lower line BML3 and the second upper line SD2. Thus, a short circuit due to current leakage may occur in an area where the third lower line BML3 and the second upper line SD2 overlap. Accordingly, in the area where the ninth gate electrode GAT9 overlaps the third lower line BML3 and the second upper line SD2, the ninth gate electrode GAT9 may be disposed as the floating electrode between the third lower line BML3 and the second upper line SD2 to prevent the short circuit between the third lower line BML3 and the second upper line SD2.

For example, different voltages may be applied to the seventh lower line BML10 and the fifth upper line SD20. Accordingly, a short circuit due to current leakage may occur in an area where the seventh lower line BML10 and the fifth upper line SD20 overlap. Accordingly, in the area where the eleventh gate electrode GAT11 overlaps the seventh lower line BML10 and the fifth upper line SD20, the eleventh gate electrode GAT11 may be disposed as the floating electrode between the seventh lower line BML10 and the fifth upper line SD20 to prevent the short circuit between the seventh lower line BML10 and the fifth upper line SD20.

As the tenth gate electrode GAT10, the ninth gate electrode GAT9, and the eleventh gate electrode GAT11 are disposed as floating electrodes, Current leakage may be suppressed in an area where the lower line (e.g., the first lower line BML1) and the upper line (e.g., the fifth upper line SD20) overlap. Accordingly, the short circuit between the lower line and the upper line may be prevented.

Figure 10:
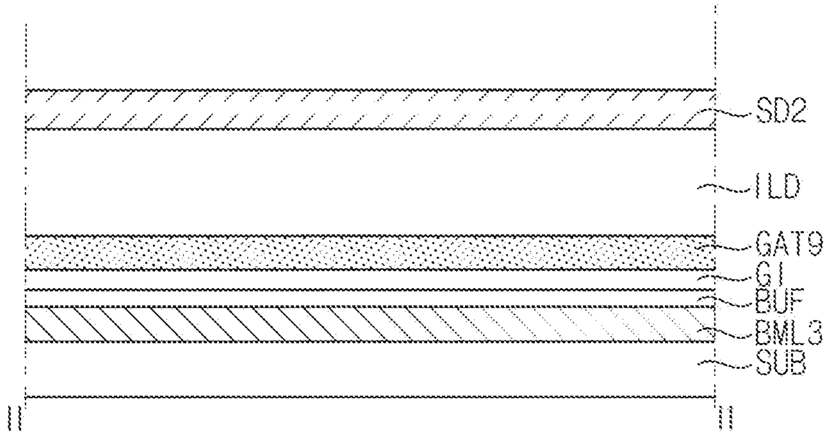
FIG. 10 is a schematic cross-sectional view illustrating an embodiment taken along the line II-II' of FIG. 9.

FIG. 10 is a schematic cross-sectional view illustrating an embodiment taken along the line II-II' of FIG. 9. FIG. 10 may correspond to a schematic diagram illustrating one of the areas where the floating electrode is disposed.

Referring to FIG. 10, the third lower line BML3, the first insulating layer BUF, the second insulating layer GI, the ninth gate electrode GAT9, the third insulating layer ILD, and the second upper line SD2 on the substrate SUB may be sequentially stacked. In case that the second upper line SD2 is damaged and is cut, the ninth gate electrode GAT9 may protect the third lower line BML3 from being damaged. For example, in some embodiments, a distance between the second upper line SD2 and the ninth gate electrode GAT9 may be greater than a distance between the third lower line BML3 and the ninth gate electrode GAT9.

Accordingly, an impact caused by cutting the second upper line SD2 may not be transferred to an electrode or a line disposed below. For example, a thickness of the third insulating layer ILD may be greater than a thickness of the first insulating layer BUF and/or the second insulating layer GI.

Figure 11:
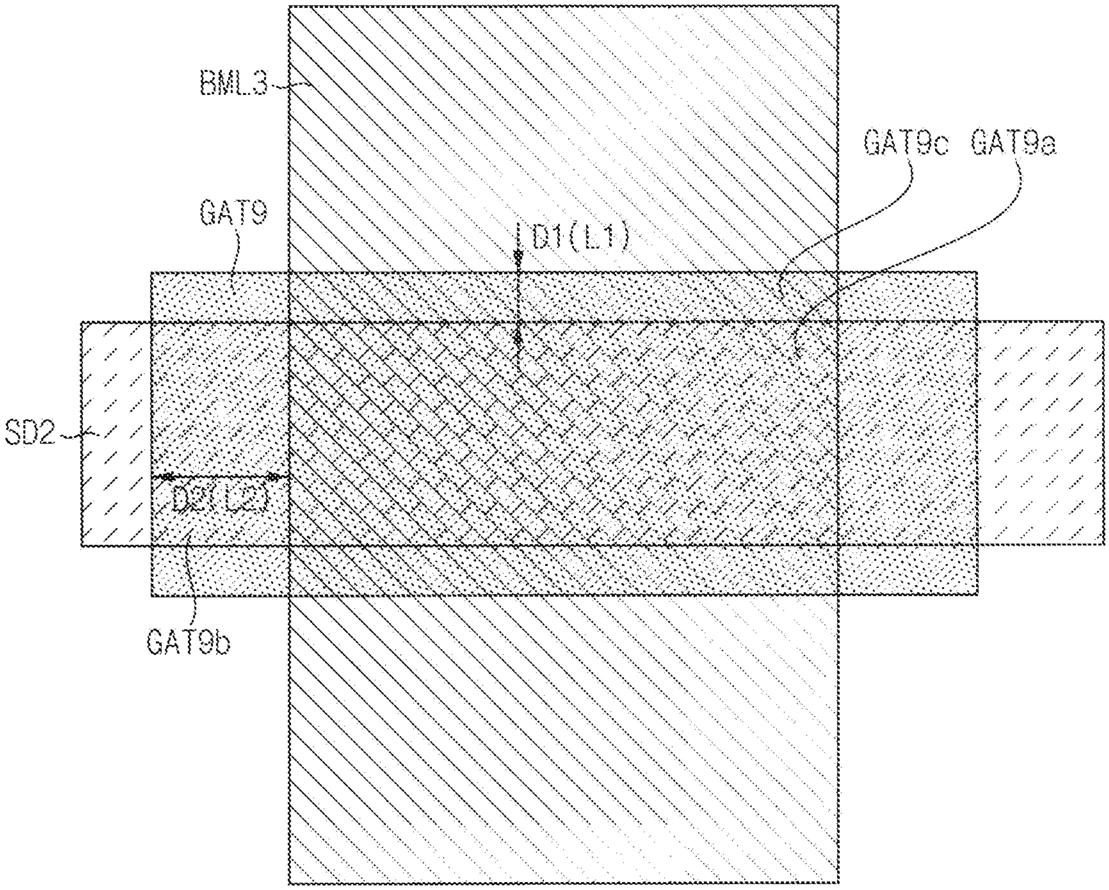
FIG. 11 is a schematic plan view illustrating some of the configurations of FIG. 10 in a plan view.

FIG. 11 is a schematic plan view illustrating some of the configurations of FIG. 10 in a plan view.

Referring to FIG. 11, a distance D2 at which the ninth gate electrode GAT9 extends in a direction in which the second upper line SD2 extends from a crossing area where the third lower line BML3 and the second upper line SD2 cross (or overlaps) may be longer than a distance D1 at which the ninth gate electrode GAT9 extends in a direction in which the third lower line BML3 extends from the crossing area. For example, the ninth gate electrode GAT9 may include a crossing portion GAT9*a* overlapping the third lower line BML3 and the second upper line SD2, a first portion GAT9*b* extending from the crossing portion GAT9*a* in the direction in which the second upper line SD2 extends, and a second portion GAT9*c* extending from the crossing portion GAT9*a* in the direction in which the third lower line BML3 extends. For example, a length L2 of the first portion GAT9*b* of the ninth gate electrode GAT9 in the direction in which the second upper line SD2 extends is longer than a length L1 of the second portion GAT9*c* of the ninth gate electrode GAT9 in the direction in which the third lower line BML3 extends.

Accordingly, in case that the second upper line SD2 is damaged and cut, the ninth gate electrode GAT9 may sufficiently function as a protective layer of the third lower line BML3 because the ninth gate electrode GAT9 entirely overlaps the crossing area where the third lower line BML3 and the second upper line SD2 overlaps.

Figure 12:
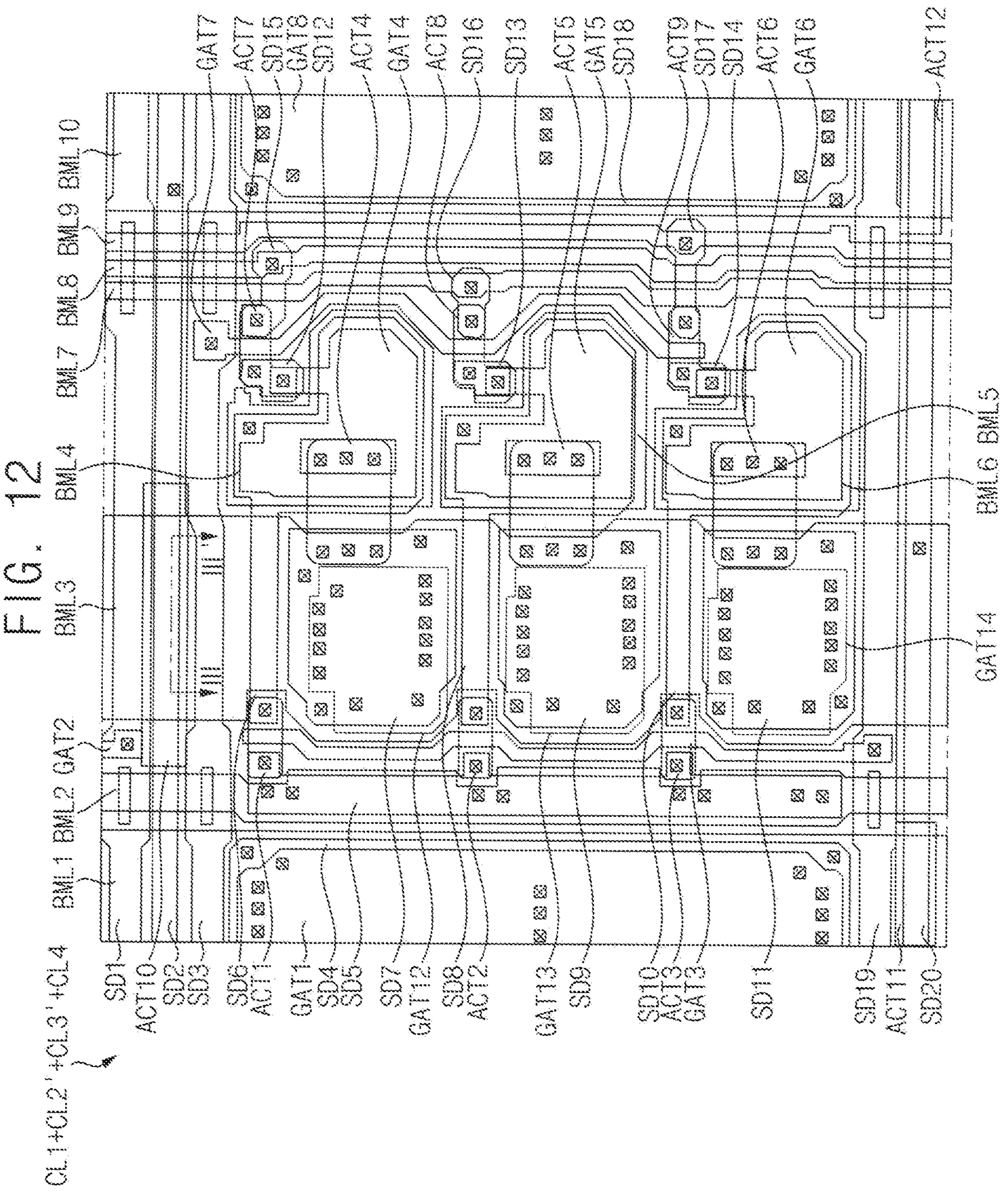
FIG. 12 is a schematic diagram combining FIGS. 2, 4, 6 and 7.

FIG. 12 is a schematic diagram combining FIGS. 2, 4, 6 and 7.

Referring to FIG. 12, different voltages may be applied to the first lower line BML1 and the fifth upper line SD20. Thus, a short circuit due to current leakage may occur in an area where the first lower line BML1 and the fifth upper line SD20 overlap. Accordingly, in the area where the eleventh active pattern ACT11 overlaps the first lower line BML1 and the fifth upper line SD20, the eleventh active pattern ACT11 may be disposed as a floating electrode between the first lower line BML1 and the fifth upper line SD20 to prevent the short circuit between the first lower line BML1 and the fifth upper line SD20.

For example, different voltages may be applied to the third lower line BML3 and the second upper line SD2. Thus, a short circuit due to current leakage may occur in an area where the third lower line BML3 and the second upper line SD2 overlap. Accordingly, in the area where the tenth active pattern ACT10 overlaps the third lower line BML3 and the second upper line SD2, the tenth active pattern ACT10 may be disposed as a floating electrode between the third lower line BML3 and the second upper line SD2 to prevent the short circuit between the third lower line BML3 and the second upper line SD2.

For example, different voltages may be applied to the seventh lower line BML10 and the fifth upper line SD20. Thus, a short circuit due to current leakage may occur in an area where the seventh lower line BML10 and the fifth upper line SD20 overlap. Accordingly, in the area where the twelfth active pattern ACT12 overlaps the seventh lower line BML10 and the fifth upper line SD20, the twelfth active pattern ACT12 may be disposed as a floating electrode between the seventh lower line BML10 and the fifth upper line SD20 to prevent the short circuit between the seventh lower line BML10 and the fifth upper line SD20.

As the eleventh active pattern ACT11, the tenth active pattern ACT10, and the twelfth active pattern ACT12 are disposed as floating electrodes, current leakage may be suppressed in an area where the lower line (e.g., the first lower line BML1) and the upper line (e.g., the fifth upper line SD20) overlap. Accordingly, the short circuit between the lower line and the upper line may be prevented.

Figure 13:
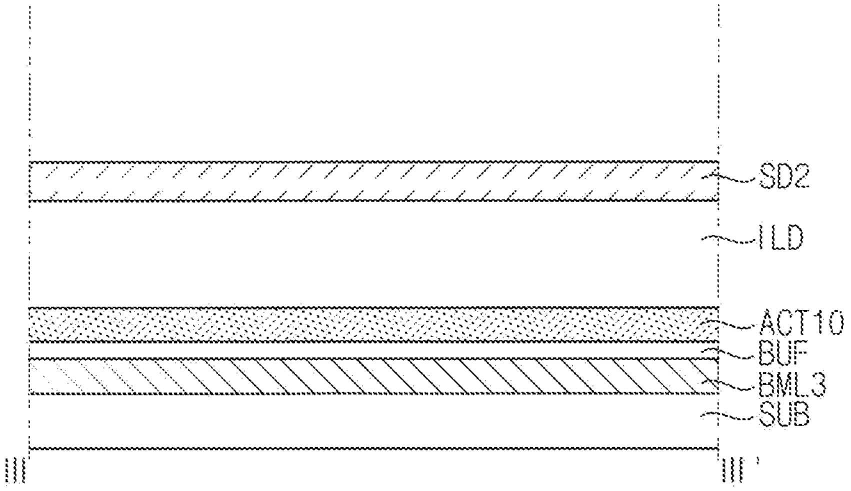
FIG. 13 is a schematic cross-sectional view illustrating an embodiment taken along line III-III' of FIG. 12.

FIG. 13 is a schematic cross-sectional view illustrating an embodiment taken along line III-III' of FIG. 12. FIG. 13 may correspond to a schematic diagram illustrating one of the areas in which the floating electrode is disposed.

Referring to FIG. 13, the third lower line BML3, the first insulating layer BUF, the tenth active pattern ACT10, the third insulating layer ILD, and the second upper line SD2 on the substrate SUB may be sequentially stacked. In case that the second upper line SD2 is damaged and is cut, the tenth active pattern ACT10 may protect the third lower line BML3 from being damaged. In some embodiments, a distance between the second upper line SD2 and the tenth active pattern ACT10 may be greater than a distance between the third lower line BML3 and the tenth active pattern ACT10. Accordingly, an impact caused by cutting the second upper line SD2 may not be transferred to an electrode or a line disposed below. For example, a thickness of the third insulating layer ILD may be greater than a thickness of the first insulating layer BUF.

Figure 14:
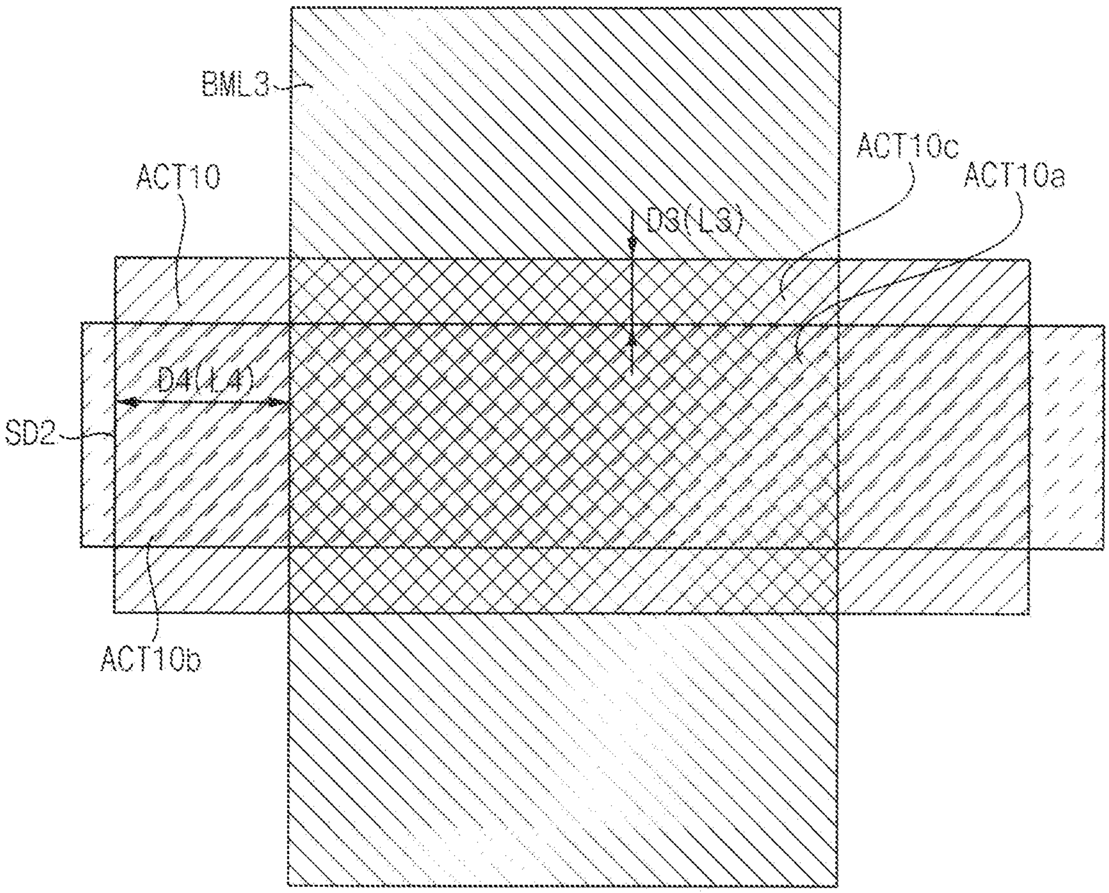
FIG. 14 is a schematic plan view illustrating some of the configurations of FIG. 13 in a plan view.

FIG. 14 is a schematic plan view illustrating some of the configurations of FIG. 13 in a plan view.

Referring to FIG. 14, a distance D4 at which the tenth active pattern ACT10 extends in a direction in which the second upper line SD2 extends from a crossing area where the third lower line BML3 and the second upper line SD2 cross may be longer than a distance D3 at which the tenth active pattern ACT10 extends in a direction in which the third lower line BML3 extends from the crossing area. For example, the tenth active pattern ACT10 may include a crossing portion ACT10*a* overlapping the third lower line BML3 and the second upper line SD2, a first portion ACT10*b* extending from the crossing portion ACT10*a* in the direction in which the second upper line SD2 extends, and a second portion ACT10*c* extending from the crossing portion ACT10*a* in the direction in which the third lower line BML3 extends. For example, a length L4 of the first portion ACT10*b* of the tenth active pattern ACT10 in the direction in which the second upper line SD2 extends is longer than a length L3 of the second portion ACT10*c* of the tenth active pattern ACT10 in the direction in which the third lower line BML3 extends.

Accordingly, in case that the second upper line SD2 is damaged and is cut, the tenth active pattern ACT10 may sufficiently function as a protective layer of the third lower line BML3 because the tenth active pattern ACT10 entirely overlaps the crossing area where the third lower line BML3 and the second upper line SD2 overlaps.

Figure 15:
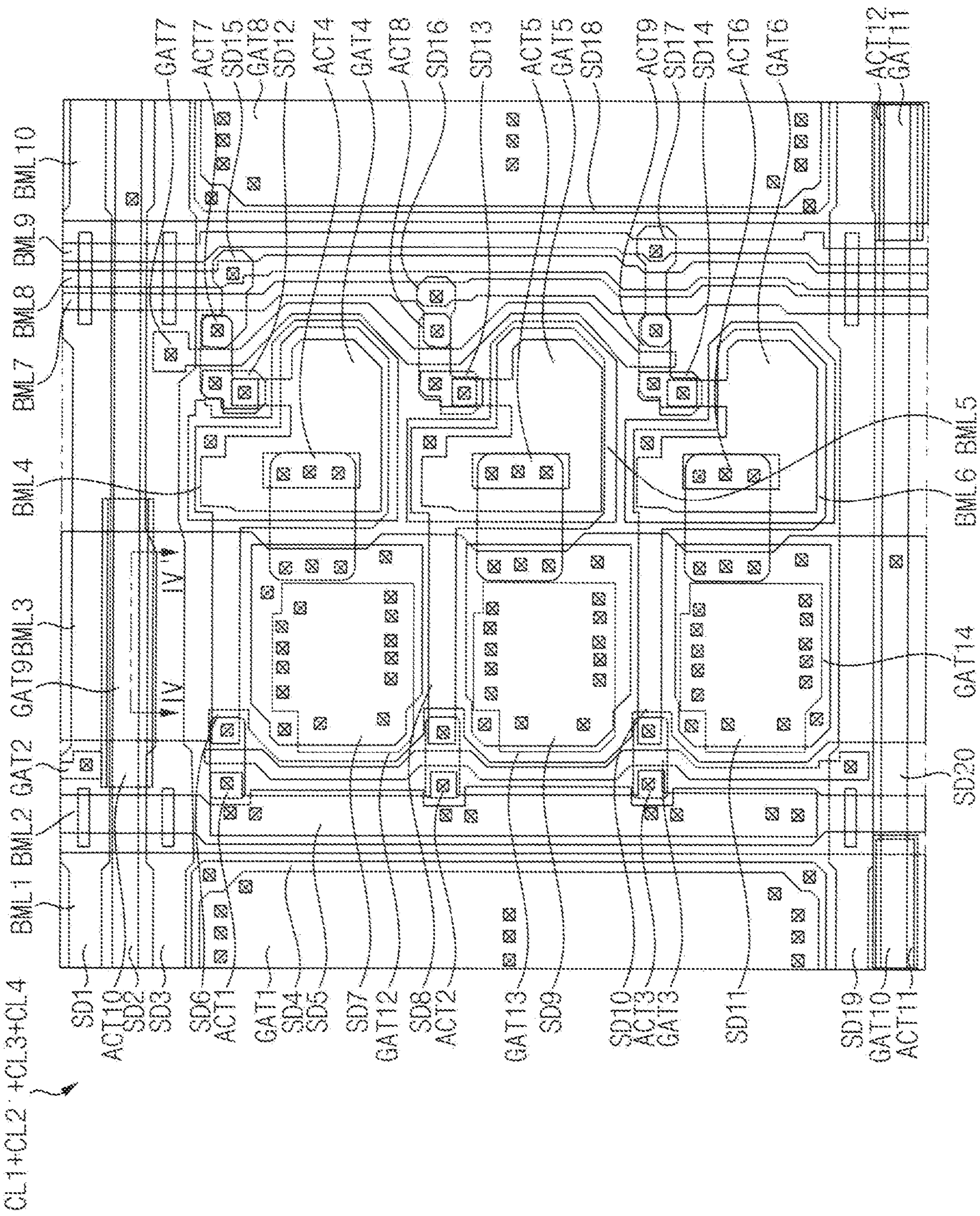
FIG. 15 is a schematic diagram combining FIGS. 2, 4, 5 and 7.

FIG. 15 is a schematic diagram combining FIGS. 2, 4, 5 and 7.

FIG. 15 may be substantially the same as FIG. 9 or FIG. 12, except that the active patterns ACT10, ACT11, and ACT12 and the gate electrodes GAT9, GAT10, and GAT11 are disposed together as floating electrodes. Accordingly, a redundant description will be omitted for descriptive convenience.

Figure 16:
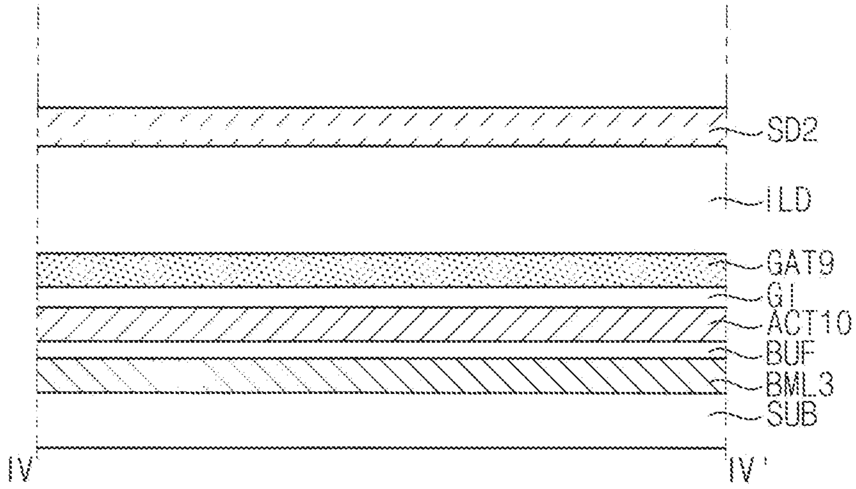
FIG. 16 is a schematic cross-sectional view illustrating an embodiment taken along line IV-IV' of FIG. 15.

FIG. 16 is a schematic cross-sectional view illustrating an embodiment taken along line IV-IV' of FIG. 15. FIG. 16 may be substantially the same as FIG. 10 or FIG. 13, except that the tenth active pattern ACT10 and the ninth gate electrode GAT9 are disposed together. Accordingly, a redundant description will be omitted for descriptive convenience.

Figure 17:
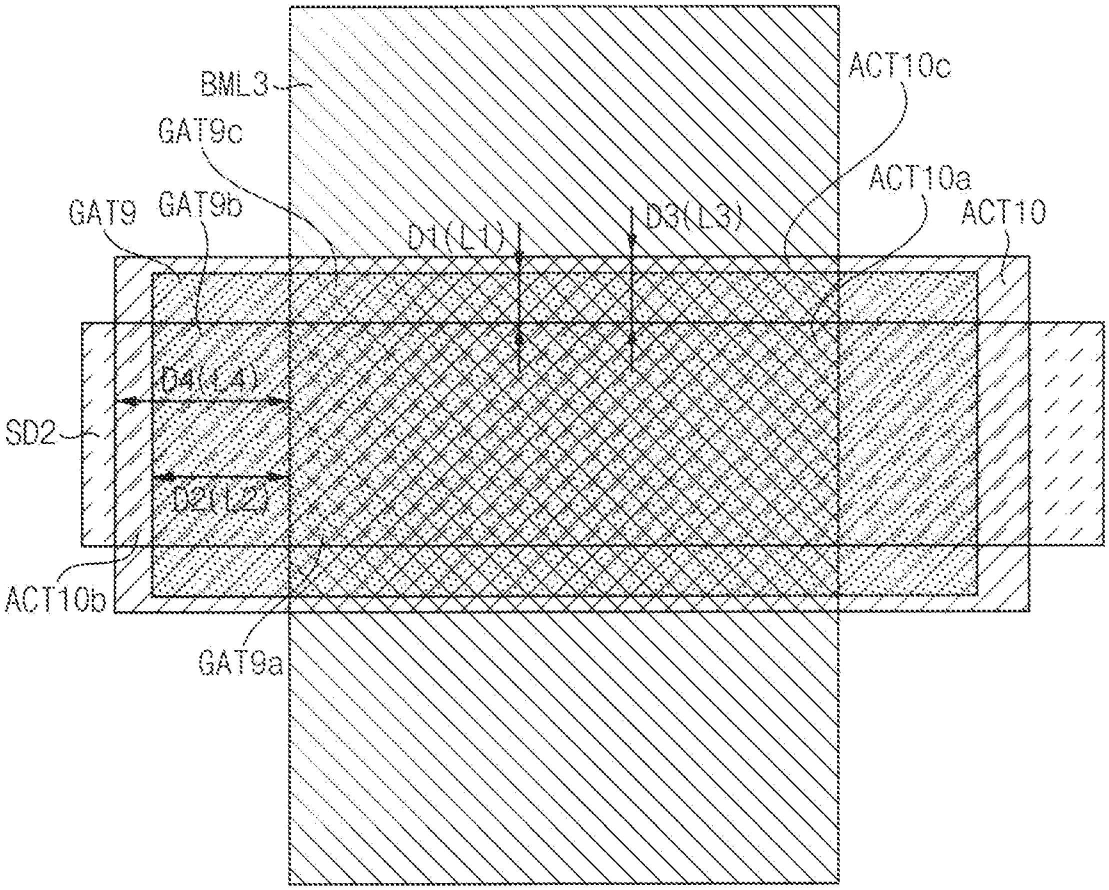
FIG. 17 is a schematic plan view illustrating some of the configurations of FIG. 16 in a plan view.

FIG. 17 is a schematic plan view illustrating some of the configurations of FIG. 16 in a plan view.

Referring to FIG. 17, distances D3 and D4 at which the tenth active pattern ACT10 extends from the crossing area may be longer than distances D1 and D2 at which the ninth gate electrode GAT9 extends from the crossing area. For example, the length L4 of the first portion ACT10*b* of the tenth active pattern ACT10 may be longer than the length L2 of the first portion GAT9*b* of the ninth gate electrode GAT9. The length L3 of the second portion ACT10*c* of the tenth active pattern ACT10 may be longer than the length L1 of the second portion GAT9*c* of the ninth gate electrode GAT9. Thus, the tenth active pattern ACT10 may effectively supplement the step coverage between the upper and lower lines.

FIGS. 18, 19, 20, 21, and 22 are schematic plan views illustrating embodiments of power supply lines and a floating electrode.

Figure 18:
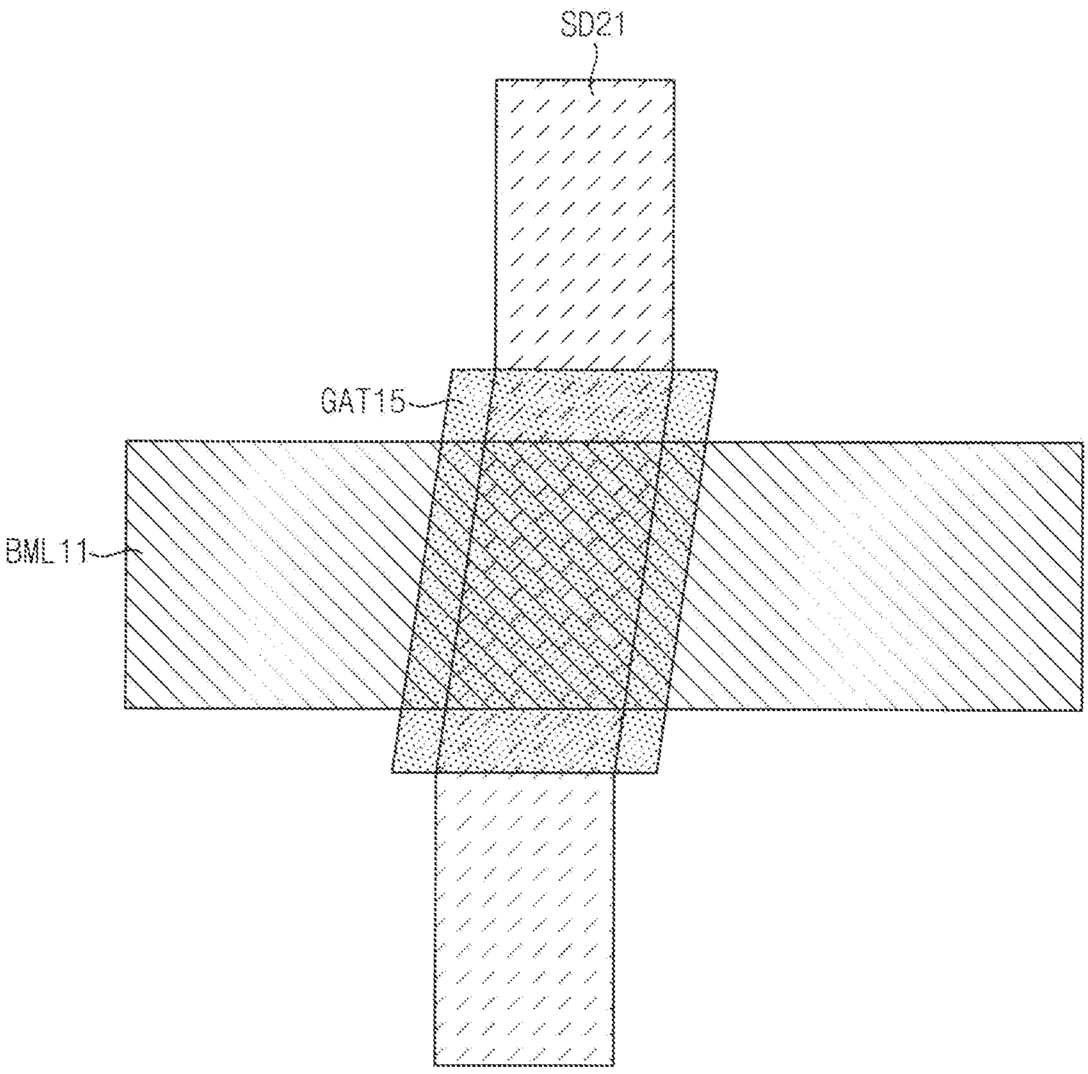
FIGS. 18, 19, 20, 21, and 22 are schematic plan views illustrating embodiments of power supply lines and a floating electrode.

Referring to FIG. 18, a lower line BML11 and an upper line SD21 may cross each other at an angle θ. For example, a gate electrode GAT15 (as the floating electrode) may be formed along a shape of the oblique crossing area.

Figure 19:
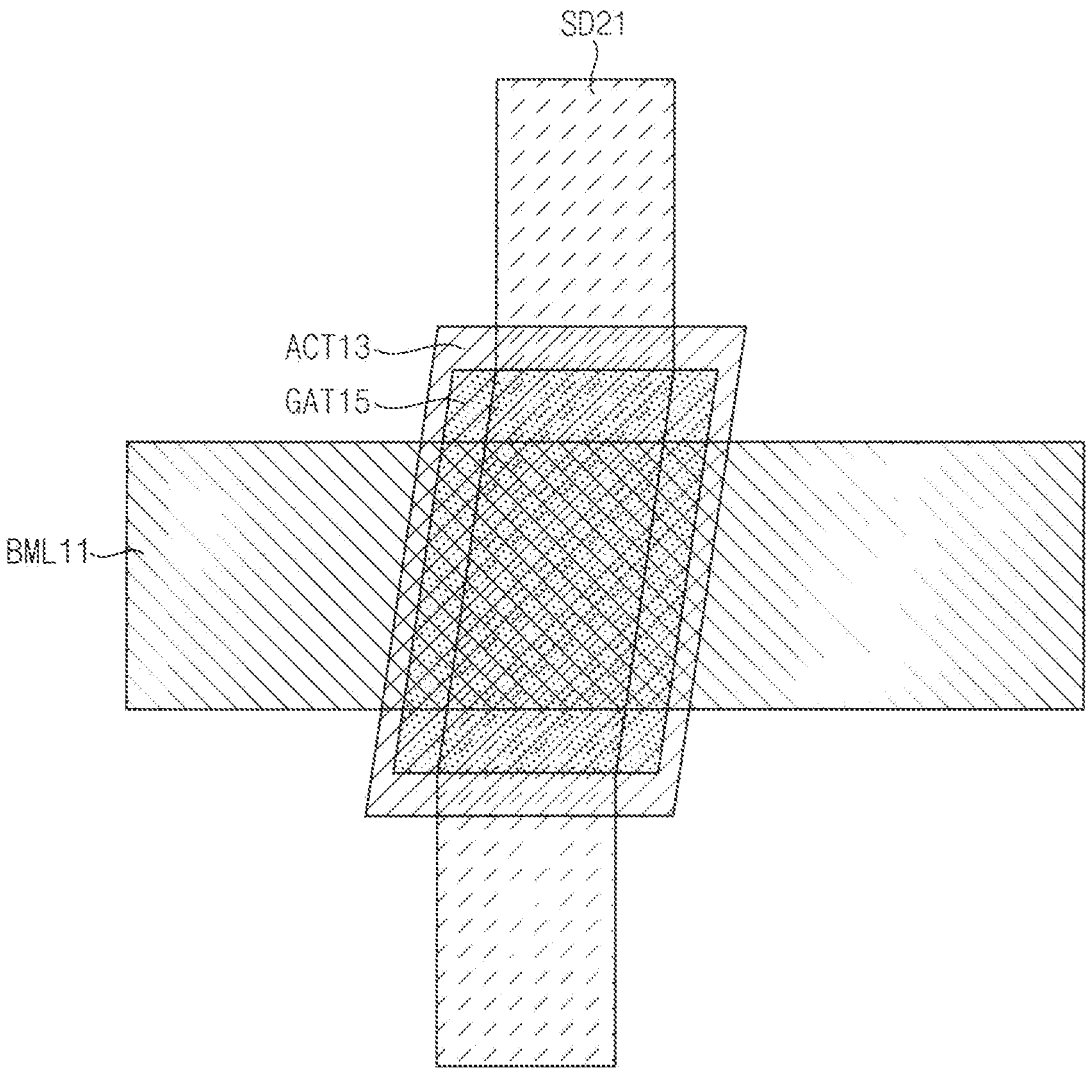

Referring to FIG. 19, an active pattern ACT13 (as a floating electrode) may be formed to have substantially the same shape as and may be disposed as a floating electrode together with the gate electrode GAT15.

Figure 20:
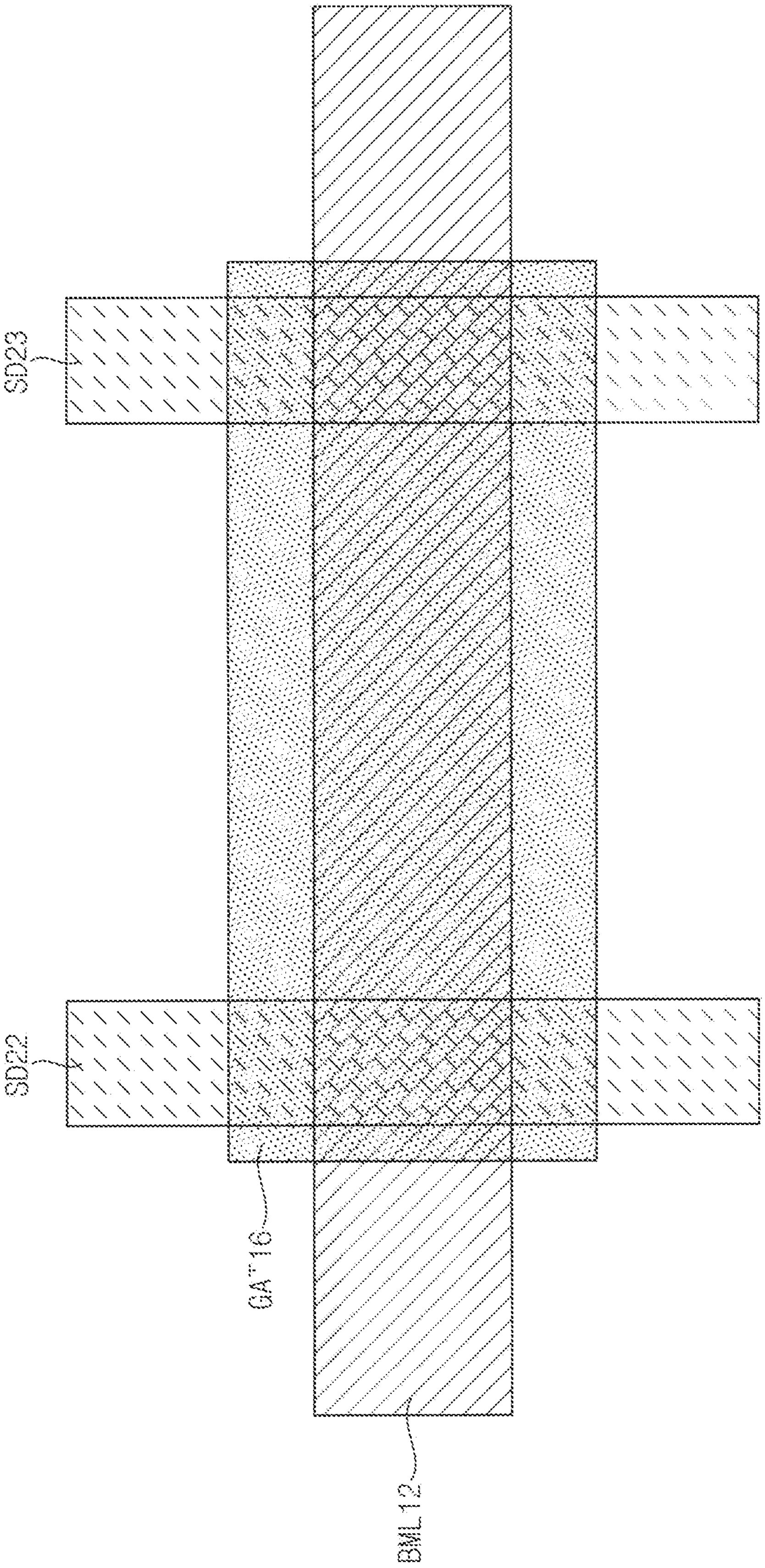

Referring to FIG. 20, one gate electrode GAT16 may be disposed as a floating electrode in two crossing areas. For example, different voltages may be applied to a lower line BML12 and upper lines SD22 and SD23. For example, an initialization voltage may be applied to the lower line BML12, a high power voltage may be applied to the one upper line SD22, and a low power voltage may be applied to the other upper line SD23. In another example, an initialization voltage may be applied to the lower line BML12, and a high power voltage may be applied to the upper lines SD22 and SD23. For example, various voltages may be dividedly applied to the upper and lower lines, and a floating electrode may be disposed to prevent a short circuit due to current leakage in an area where the upper and lower lines cross. For example, in order to prevent the short circuit between the upper and lower lines, each end of the floating electrode may have a longer a distance in the extending direction of the upper line than a distance in the extending direction of the lower line.

Figure 21:
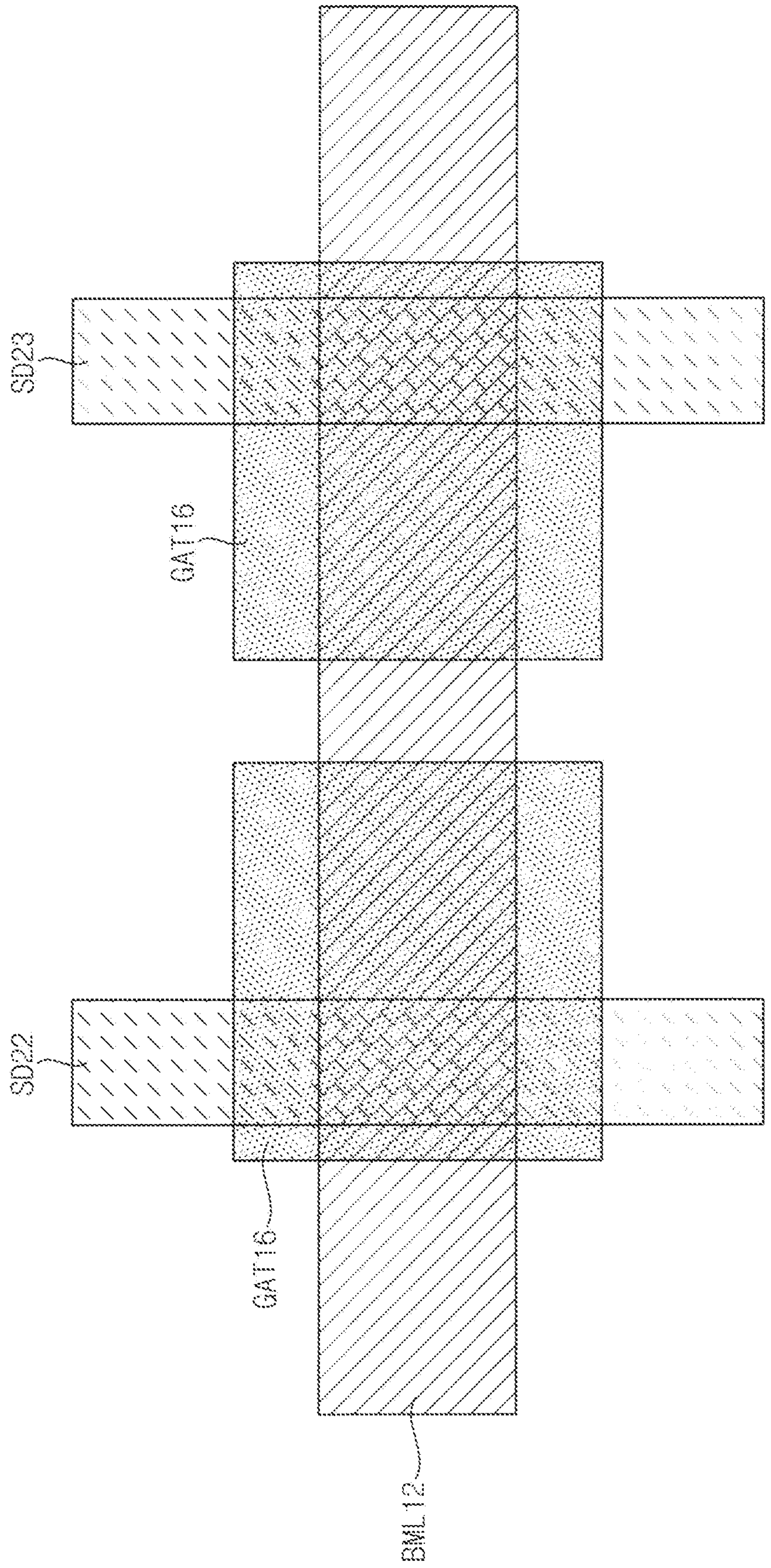
Figure 22:
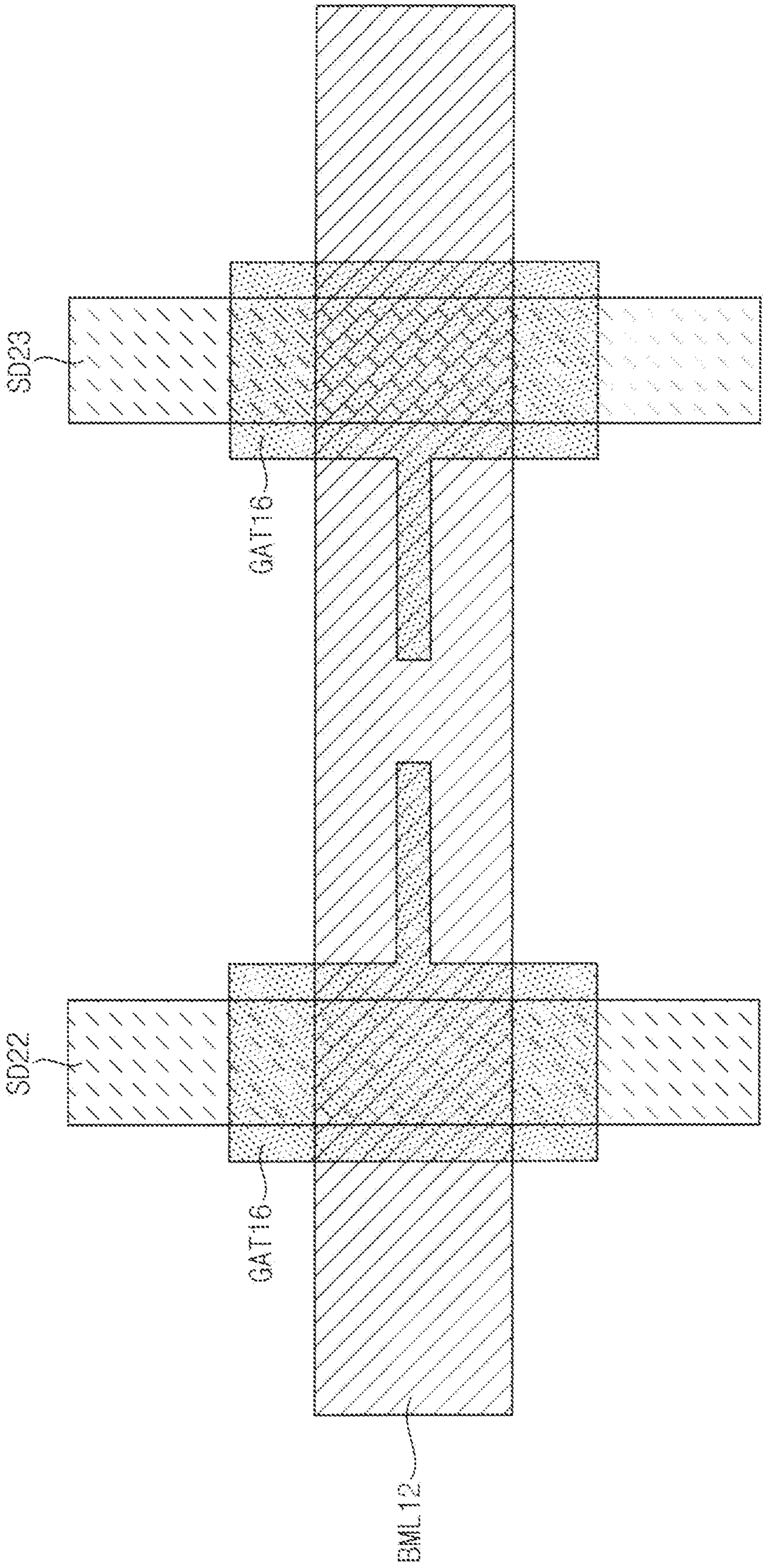

In another example, as shown in FIG. 21 or FIG. 22, the gate electrodes GAT16 may be disposed to be spaced apart from each other. For example, as different voltages are applied to the upper lines SD22 and SD23, a short circuit that may occur in one gate electrode GAT16 may be prevented.

The gate electrode GAT16 may be removed by etching in the process of forming the contact hole. Depending on the design, the gate electrode GAT16 may be etched to have a rectangular shape as shown in FIG. 21 or may be etched to form protrusion portion protruding in opposite directions as shown in FIG. 22. In case that formed as in FIG. 21 or 22, the area occupied by the gate electrode GAT16 may be reduced, so that space may be additionally utilized in case that designing a layout. In FIG. 22, an area occupied by the gate electrode GAT16 may be reduced more effectively than in FIG. 21 and an area formed in the contact hole may be reduced.

Figure 23:
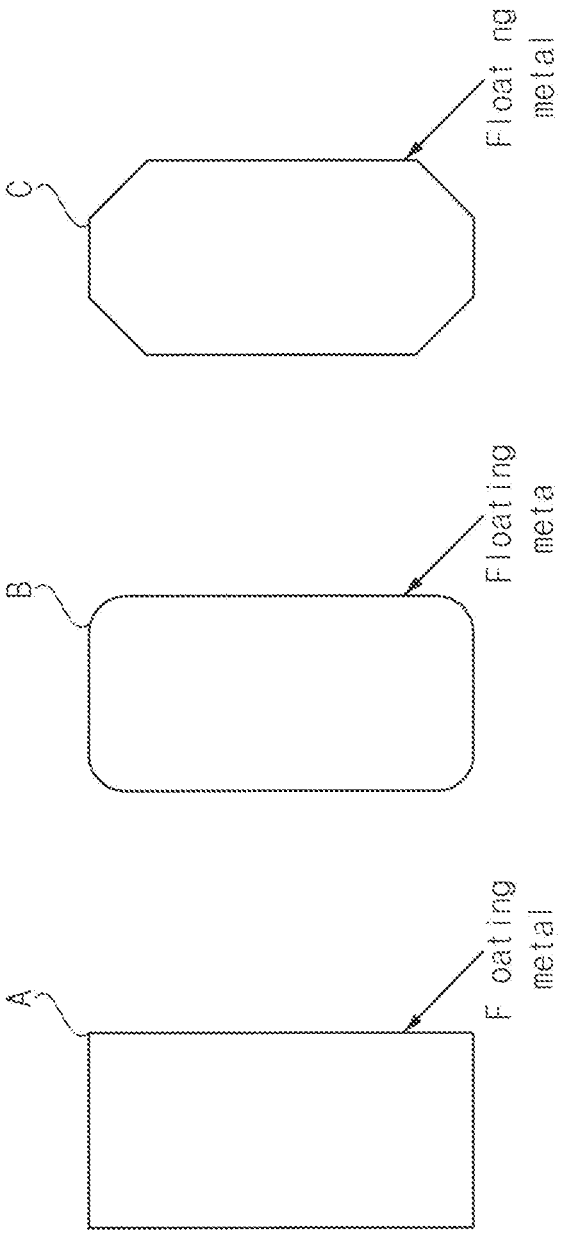
FIG. 23 is a schematic diagram illustrating a shape of a floating electrode.

FIG. 23 is a schematic diagram illustrating a shape of a floating electrode.

Referring to FIG. 23, each of the above-described floating electrodes may have a polygonal shape. For example, the floating electrodes may be formed to have a rectangular shape (refer to A), but embodiments are not limited thereto. Each of the floating electrodes may have an octangular shape (refer to C), or may be formed to have a shape having rounded corner portions in a square (refer to B).

In case that compared to a rectangular shape, a floating electrode having a rounded corner portion or a floating electrode having a polygonal shape having more sides may be advantageous in ensuring step coverage.

The invention can be applied to various display devices. For example, the invention is applicable to various display devices such as display devices for vehicles, ships and aircraft, portable communication devices, display devices for exhibition or information transmission, medical display devices, and the like.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
- a substrate;
- a first lower line disposed over the substrate in a thickness direction, the first lower line extending in a first direction, the first lower line that applies a first voltage having a first level to a light emitting element;
- a first upper line disposed over the first lower line in the thickness direction, the first upper line extending in a second direction perpendicular to the first direction, and crossing the first lower line, the first upper line that applies a second voltage having a second level different from the first level of the first voltage; and
- a first floating electrode disposed between the first lower line and the first upper line, with respect to the thickness direction, the first floating electrode including:
  - a crossing portion overlapping the first lower line and the first upper line;
  - a first portion extending from the crossing portion of the first floating electrode in the second direction; and
  - a second portion extending from the crossing portion of the first floating electrode in the first direction,
- wherein a length of the first portion of the first floating electrode in the second direction is longer than a length of the second portion of the first floating electrode in the first direction, and
- wherein the first direction and the second direction occupy a plane that is tangential to the thickness direction.

2. The display device of claim 1, further comprising:
- a first insulating layer disposed between the first lower line and the first floating electrode, with respect to the thickness direction; and
- a second insulating layer disposed between the first floating electrode and the first upper line, with respect to the thickness direction,
- wherein a thickness of the second insulating layer is greater than a thickness of the first insulating layer.

3. The display device of claim 1, further comprising:
- a second floating electrode disposed between the first lower line and the first floating electrode, the second floating electrode including:
  - a crossing portion overlapping the first lower line, the first upper line, and the first floating electrode;
  - a first portion extending from the crossing portion of the second floating electrode in the second direction; and
  - a second portion extending from the crossing portion of the second floating electrode in the first direction,
- wherein a length of the first portion of the second floating electrode in the second direction is longer than a length of the second portion of the second floating electrode in the first direction.

4. The display device of claim 1, wherein the first floating electrode has a polygonal shape in a plan view.

5. The display device of claim 1, wherein the first floating electrode has a rectangular shape in a plan view.

6. The display device of claim 1, further comprising:
- a second lower line disposed on the substrate, extending in the first direction, and spaced apart from the first lower line in the second direction, the second lower line that applies the second voltage;
- a second upper line disposed on the first lower line, extending in the second direction, spaced apart from the first upper line in the first direction, and crossing the second lower line, the second upper line that applies the first voltage; and
- a second floating electrode disposed between the second lower line and the second upper line, the second floating electrode including:
  - a crossing portion overlapping the second lower line and the second upper line;
  - a first portion extending from the crossing portion of the second floating electrode in the second direction; and
  - a second portion extending from the crossing portion of the second floating electrode in the first direction,
- wherein a length of the first portion of the second floating electrode in the second direction is longer than a length of the second portion of the second floating electrode in the first direction.

7. The display device of claim 1, further comprising:
- a second lower line disposed on the substrate and extending in the first direction;
- a second upper line and a third upper line disposed on the second lower line, extending in the second direction, spaced apart from each other in the first direction, and crossing the second lower line, respectively; and
- a second floating electrode disposed between the second lower line and the second upper line in a crossing area where the second lower line and the second upper line overlap each other and between the second lower line and the third upper line in a crossing area where the second lower line and the third upper line overlap each other.

8. The display device of claim 1, further comprising:
- a second lower line disposed on the substrate and extending in the first direction;
- a second upper line and a third upper line disposed on the second lower line, extending in the second direction, spaced apart from each other in the first direction, and crossing the second lower line, respectively;
- a second floating electrode disposed between the second lower line and the second upper line in a crossing area where the second lower line and the second upper line overlap each other; and a third floating electrode disposed between the second lower line and the third upper line in a crossing area where the second lower line and the third upper line overlap each other.

9. The display device of claim 1, further comprising:

a first insulating layer disposed between the first lower line and the first floating electrode; and a second insulating layer disposed between the first floating electrode and the first upper line, wherein a thickness of the second insulating layer is greater than a thickness of the first insulating layer, and the first floating electrode has a polygonal shape in a plan view.

10. The display device of claim 1, wherein the light emitting element includes:

an anode electrode;

an intermediate layer disposed on the anode electrode; and a cathode electrode disposed on the intermediate layer, the first voltage is applied to the anode electrode, and the second voltage is applied to the cathode electrode.

11. The display device of claim 3, wherein the length of the first portion of the second floating electrode in the second direction is longer than the length of the first portion of the first floating electrode in the second direction.

12. The display device of claim 3, wherein the first floating electrode includes a metal, and the second floating electrode includes a semiconductor material.

13. The display device of claim 4, wherein each corner portion of the first floating electrode is rounded.

14. The display device of claim 6, further comprising:

a third floating electrode disposed between the second lower line and the second floating electrode, the third floating electrode including:

a crossing portion overlapping the second lower line, the second upper line, and the second floating electrode;

a first portion extending from the crossing portion of the third floating electrode in the second direction; and a second portion extending from the crossing portion of the third floating electrode in the first direction, wherein a length of the first portion of the third floating electrode in the second direction is longer than a length of the second portion of the third floating electrode in the first direction.

15. The display device of claim 14, wherein the length of the first portion of the third floating electrode in the second direction is longer than the length of the first portion of the second floating electrode in the second direction.

16. The display device of claim 14, wherein the first floating electrode includes a metal, and the third floating electrode includes a semiconductor material.

17. The display device of claim 8, wherein each of the second floating electrode and the third floating electrode includes protrusion portion protruding in opposite directions.

18. The display device of claim 9, wherein the first floating electrode has a rectangular shape in the plan view.

19. The display device of claim 9, wherein each corner portion of the first floating electrode is rounded.

20. The display device of claim 9, further comprising:

a second floating electrode disposed between the first lower line and the first floating electrode, the second floating electrode including:

a crossing portion overlapping the first lower line and the first floating electrode;

a first portion extending from the crossing portion of the second floating electrode in the second direction; and a second portion extending from the crossing portion of the second floating electrode in the first direction, wherein the first floating electrode includes a metal, and the second floating electrode includes a semiconductor material.

* * * * *